(12) United States Patent
Hashimoto

(10) Patent No.: US 12,433,077 B2
(45) Date of Patent: Sep. 30, 2025

(54) LIGHT-EMITTING DEVICE INCLUDING SUPPORT MEMBER WITH HOLE PORTION

(71) Applicant: NICHIA CORPORATION, Anan (JP)

(72) Inventor: Toru Hashimoto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 697 days.

(21) Appl. No.: 17/551,423

(22) Filed: Dec. 15, 2021

(65) Prior Publication Data

US 2022/0199878 A1 Jun. 23, 2022

(30) Foreign Application Priority Data

Dec. 21, 2020 (JP) ................................. 2020-211367
Mar. 10, 2021 (JP) ................................. 2021-037915
Apr. 27, 2021 (JP) ................................. 2021-074896

(51) Int. Cl.
*H10H 20/857* (2025.01)
*H10H 20/814* (2025.01)
*H10H 20/831* (2025.01)

(52) U.S. Cl.
CPC ........ *H10H 20/857* (2025.01); *H10H 20/814* (2025.01); *H10H 20/8312* (2025.01)

(58) Field of Classification Search
None
See application file for complete search history.

(56) References Cited

U.S. PATENT DOCUMENTS 9,825,016 B1 * 11/2017 Kim ........................ H01L 25/16
2012/0002420 A1 * 1/2012 Noboru ................. H01L 33/486

| 2019/0363226 | A1 * | 11/2019 | Musashi ................. H01L 33/58 |
| 2020/0044121 | A1 | 2/2020 | Imada et al. |
| 2020/0077526 | A1 | 3/2020 | Maeda et al. |
| 2020/0105658 | A1 * | 4/2020 | Baba ................. H01L 23/49805 |
| 2020/0203281 | A1 * | 6/2020 | Fujikawa ............ G02F 1/13454 |
| 2020/0313049 | A1 * | 10/2020 | Huang ................... H01L 33/60 |
| 2020/0343407 | A1 | 10/2020 | Minato et al. |
| 2020/0379165 | A1 * | 12/2020 | Hayashi ............... G02B 6/0073 |

(Continued)

FOREIGN PATENT DOCUMENTS

| JP | 2002-270731 A | 9/2002 |
| JP | 2006-013118 A | 1/2006 |
| JP | 2012033855 A * | 2/2012 ............ H01L 23/36 |

(Continued)

*Primary Examiner* — Shaun M Campbell
(74) *Attorney, Agent, or Firm* — Foley & Lardner LLP

(57) ABSTRACT

A light-emitting device includes a support member that includes a wiring layer comprising a connection portion, and a hole portion; a light source located on a first surface of the support member, the light source including a positive electrode and a negative electrode; and a conductive member located in the hole portion, the conductive member connecting the connection portion and one of the positive electrode or the negative electrode. The hole portion includes a first hole portion, and a second hole portion communicating with the first hole portion. The first hole portion overlaps the one of the positive electrode or the negative electrode that is connected with the conductive member in a plan view. The second hole portion includes a first portion overlapping the first hole portion in a plan view, and a second portion extending in a first direction from the first portion toward a connection portion side.

12 Claims, 22 Drawing Sheets

(56) References Cited

U.S. PATENT DOCUMENTS

2021/0036050 A1  2/2021  Hiraide

FOREIGN PATENT DOCUMENTS

| | | |
|---|---|---|
| JP | 2015-192095 A | 11/2015 |
| JP | 2020-021899 A | 2/2020 |
| JP | 2020-035896 A | 3/2020 |
| JP | 2020-184610 A | 11/2020 |
| JP | 2021-019052 A | 2/2021 |
| JP | 2021-027128 A | 2/2021 |
| JP | 2021-027129 A | 2/2021 |

* cited by examiner

LIGHT-EMITTING DEVICE INCLUDING SUPPORT MEMBER WITH HOLE PORTION

CROSS-REFERENCE TO RELATED APPLICATIONS

This application claims priority to Japanese Patent Application No. 2020-211367, filed on Dec. 21, 2020, Japanese Patent Application No. 2021-37915, filed on Mar. 10, 2021, and Japanese Patent Application No. 2021-074896, filed on Apr. 27, 2021, the disclosures of all of which are hereby incorporated by reference in their entireties.

BACKGROUND

Embodiments of the present invention relate to a light-emitting device.

For example, Japanese Patent Publication No. 2015-192095 discusses a light-emitting device in which an LED (Light-Emitting Diode) element is mounted on a support substrate, through-holes are formed in the support substrate at positions corresponding to electrodes of the LED element, and conductive members that are connected with the electrodes of the LED element are located in the through-holes.

SUMMARY

Certain embodiments of the present disclosure are directed to a light-emitting device in which the reliability of an electrical connection between a light source and a wiring layer of a support member can be increased.

According to one embodiment, a light-emitting device includes a support member, a light source, and a conductive member. The support member includes a wiring layer including a connection portion, a first surface, a second surface positioned at a side opposite to the first surface, the connection portion of the wiring layer is located on the second surface, and a hole portion separated from the connection portion in a plan view, the hole portion extending from the first surface to the second surface. The light source is located on the first surface of the support member. The light source includes a positive electrode and a negative electrode. The conductive member is located in the hole portion. The conductive member connects the connection portion and one of the positive electrode or the negative electrode. The connection portion is located in a region other than between the positive electrode and the negative electrode in a plan view. The hole portion includes a first hole portion open at the first surface side, and a second hole portion communicating with the first hole portion, the second hole portion being open at the second surface side. The first hole portion overlaps the one of the positive electrode or the negative electrode connected with the conductive member in a plan view. The second hole portion includes a first portion overlapping the first hole portion in a plan view, and a second portion extending in a first direction, the first direction being from the first portion toward the connection portion side.

According to embodiments, the reliability of an electrical connection between a light source and a wiring layer of a support member can be increased.

DETAILED DESCRIPTION

Figure 1:
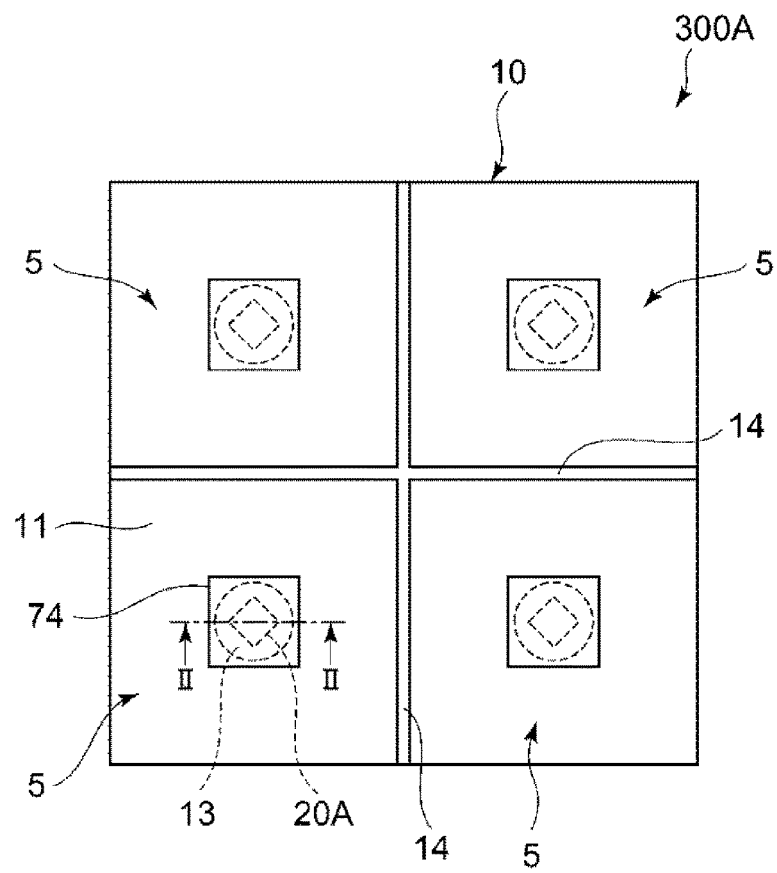
FIG. 1 is a top view of a light-emitting device of a first embodiment of the invention.

Exemplary embodiments will now be described with reference to the drawings. The drawings schematically show embodiments; therefore, the scales, spacing, positional relationships, and the like of the members may be exaggerated, some of the members may not be illustrated, and end views that show only cross sections may be used as cross-sectional views. The same configurations are marked with the same reference numerals in the drawings.

First Embodiment

FIG. 1 is a top view of a light-emitting device 300A of a first embodiment of the invention.

Figure 2:
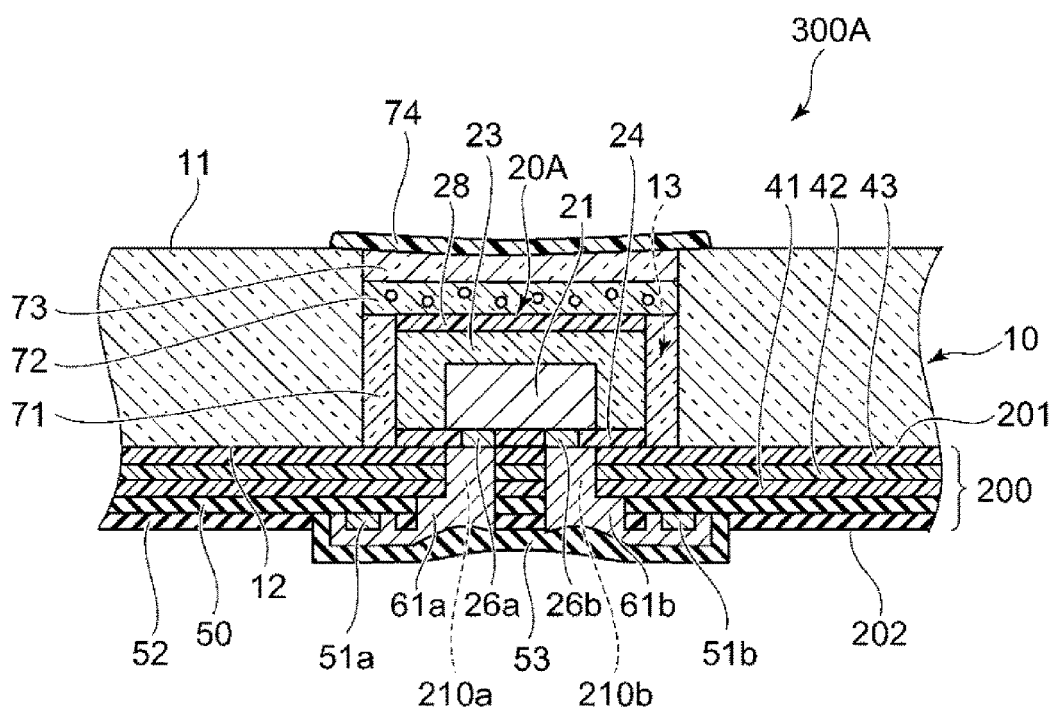
FIG. 2 is a cross-sectional view along line II-II of FIG. 1.

FIG. 2 is a cross-sectional view along line II-II of FIG. 1.

The light-emitting device 300A includes a support member 200, a light source 20A, a light guide plate 10, and conductive members 61a and 61b.

The support member 200 includes a first surface 201, a second surface 202 positioned at the side opposite to the first surface 201, and hole portions 210a and 210b. The hole portions 210a and 210b extend from the first surface 201 to the second surface 202. The support member 200 also includes connection portions 51a and 51b of the wiring layer that are located at the second surface 202 side. The light source 20A is located on the first surface 201 of the support member 200.

Figure 3A:
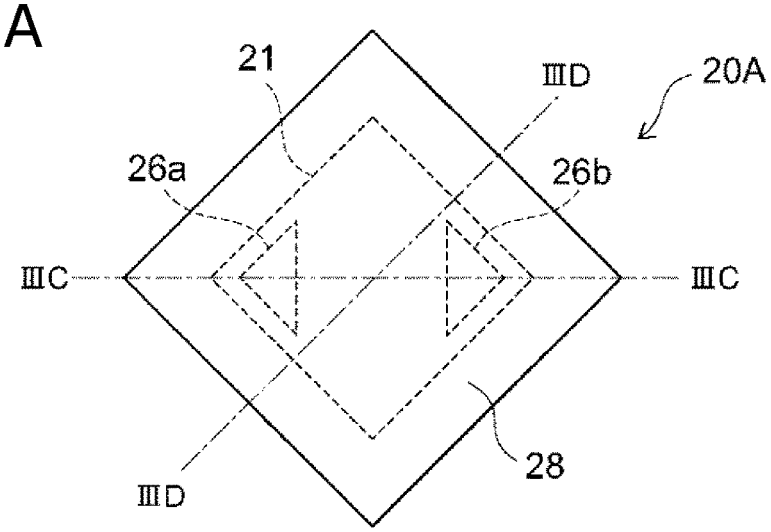
FIG. 3A is a top view of a light source of the first embodiment of the invention.

FIG. 3A is a top view of the light source 20A. In FIG. 3A, a light-emitting element 21, a positive electrode 26a, and a negative electrode 26b that are covered with a first light-modulating member 28, a first light-transmitting member 23, etc., are illustrated by broken lines.

Figure 3B:
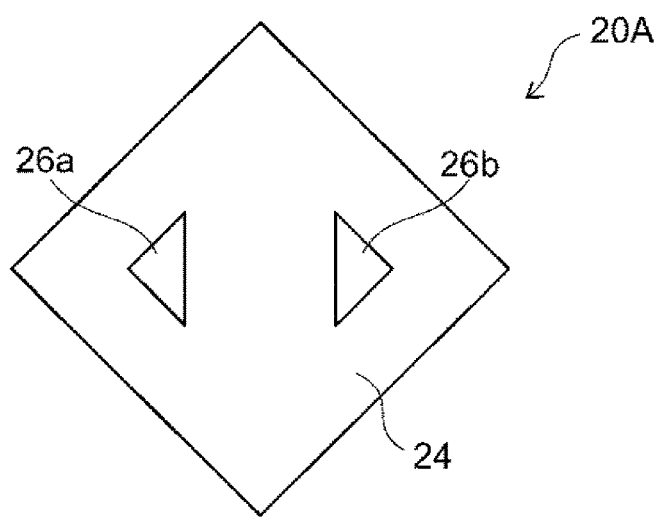
FIG. 3B is a bottom view of a light source of the first embodiment of the invention.

FIG. 3B is a bottom view of the light source 20A.

Figure 3C:
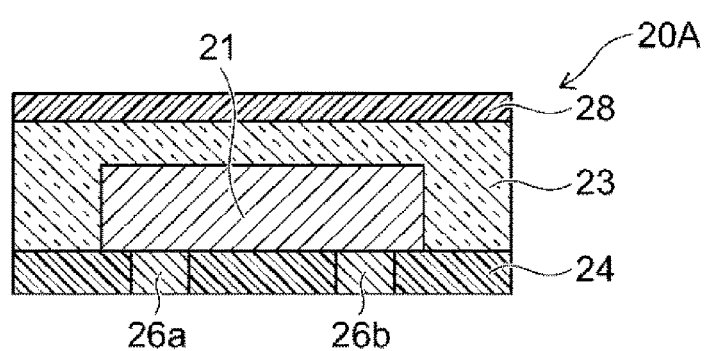
FIG. 3C is a cross-sectional view along line IIIC-IIIC of FIG. 3A.

FIG. 3C is a cross-sectional view along line IIIC-IIIC of FIG. 3A.

Figure 3D:
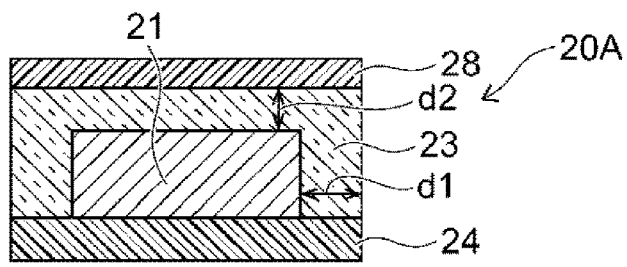
FIG. 3D is a cross-sectional view along line IIID-IIID of FIG. 3A.

FIG. 3D is a cross-sectional view along line IIID-IIID of FIG. 3A.

The light source 20A also includes at least the light-emitting element 21. Only the light-emitting element 21 can be used as the light source 20A. Alternatively, a combination of the light-emitting element 21 and another member can be used as the light source 20A. The other member includes, for example, the positive electrode 26a and the negative electrode 26b.

The light-emitting element 21 includes a semiconductor stacked body. The semiconductor stacked body includes, for example, a support substrate of sapphire, gallium nitride, or the like, an n-type semiconductor layer and a p-type semiconductor layer located on the support substrate, a light-emitting layer sandwiched between the n-type semiconductor layer and the p-type semiconductor layer, and an n-side electrode and a p-side electrode electrically connected respectively to the n-type semiconductor layer and the p-type semiconductor layer. The semiconductor stacked body may be used after removing the support substrate.

The light-emitting layer may have a structure that includes a single active layer such as a double heterostructure or a single quantum well structure (SQW), or may have a structure that includes an active layer group such as a multi-quantum well structure (MQW). The light-emitting layer is configured to emit visible light or ultraviolet light. The light-emitting layer is configured to emit blue to red as the visible light. The semiconductor stacked body that includes such a light-emitting layer can include, for example, $In_xAl_yGa_{1-x-y}N$ (0≤x, 0≤y, and x+y≤1).

The semiconductor stacked body can include at least one light-emitting layer capable of the light emission described above. For example, the semiconductor stacked body may have a structure that includes one or more light-emitting layers between the n-type semiconductor layer and the p-type semiconductor layer, or may include multiple repeated structures that each include an n-type semiconductor layer, a light-emitting layer, and a p-type semiconductor layer in this order. When the semiconductor stacked body includes multiple light-emitting layers, the multiple light-emitting layers may include light-emitting layers of different light emission peak wavelengths, or may include light-emitting layers of the same light emission peak wavelength. The light emission peak wavelengths being the same means that, for example, there may be fluctuation of about several nm. Such combinations of light-emitting layers can be selected as appropriate; for example, when the semiconductor stacked body includes two light-emitting layers, the light-emitting layers can be selected to have a combination of blue light and blue light, green light and green light, red light and red light, ultraviolet light and ultraviolet light, blue light and green light, blue light and red light, green light and red light, etc. The light-emitting layer may include multiple active layers of different light emission peak wavelengths, or may include multiple active layers of the same light emission peak wavelength.

The positive electrode 26a and the negative electrode 26b are separated from each other and are located at the lower surface of the light-emitting element 21. The positive electrode 26a is electrically connected with the p-side electrode of the light-emitting element 21, and the negative electrode 26b is electrically connected with the n-side electrode of the light-emitting element 21.

The light source 20A can further include the first light-transmitting member 23 and a cover member 24 as other members. The first light-transmitting member 23 is located at the upper surface and the side surface of the light-emitting element 21 and continuously covers the upper surface and the side surface. In the light source 20A as shown in FIG. 3D, it is favorable for a distance d1 from the side surface of the light-emitting element 21 to the side surface of the first light-transmitting member 23 to be greater than a distance d2 from the upper surface of the light-emitting element 21 to the upper surface of the first light-transmitting member 23. Thereby, the light that is emitted from the side surface of the light-emitting element 21 can propagate more easily to the side surface side than the upper surface side of the first light-transmitting member 23, and the light that is incident on the light guide plate 10 can be increased. It is favorable for the distance d1 from the side surface of the light-emitting element 21 to the side surface of the first light-transmitting member 23 to be not less than about 1.5 and not more than about 2.5 times the distance d2 from the upper surface of the light-emitting element 21 to the upper surface of the first light-transmitting member 23, and more favorable for the distance d1 to be about 2 times the distance d2. The cover member 24 is located at the lower surface of the light-emitting element 21 and covers the lower surface of the light-emitting element 21. The cover member 24 is located also at the lower surface of the first light-transmitting member 23 and continuously covers the lower surface of the light-emitting element 21 and the lower surface of the first light-transmitting member 23. For example, the first light-transmitting member 23 and the cover member 24 can protect the light-emitting element 21 from the external environment such as moisture, etc.

The first light-transmitting member 23 also includes the functions of wavelength conversion, light diffusion, and the like according to the particles added to the first light-transmitting member 23. Specifically, the first light-transmitting member 23 may include a light-transmitting resin, and may further include a phosphor. For example, a silicone resin, a phenol resin, an epoxy resin, an acrylic resin, etc., can be used as the light-transmitting resin. An yttrium-aluminum-garnet-based phosphor (e.g., $Y_3(Al, Ga)_5O_{12}$:Ce), a lutetium-aluminum-garnet-based phosphor (e.g., $Lu_3(Al, Ga)_5O_{12}$:Ce), a terbium-aluminum-garnet-based phosphor (e.g., $Tb_3(Al, Ga)_5O_{12}$:Ce), a β-sialon-based phosphor (e.g., $(Si, Al)_3(O, N)_4$:Eu), an α-sialon phosphor (e.g., $Ca(Si, Al)_{12}(O, N)_{16}$:Eu), a nitride-based phosphor such as a CASN-based phosphor (e.g., $CaAlSiN_3$:Eu), a SCASN-based phosphor (e.g., $(Sr, Ca)AlSiN_3$:Eu), or the like, a fluoride-based phosphor such as a KSF-based phosphor (e.g., $K_2SiF_6$:Mn), a KSAF-based phosphor (e.g., $K_2(Si, Al)F_6$:Mn), a MGF-based phosphor (e.g., $3.5MgO \cdot 0.5MgF_2 \cdot GeO_2$:Mn), or the like, a phosphor that has a perovskite structure (e.g., $CsPb(F, Cl, Br, I)_3$), a quantum dot phosphor (e.g., CdSe, InP, $AgInS_2$, or $AgInSe_2$), etc., can be used as the phosphor. One type of phosphor or multiple types of phosphors may be used as the phosphor added to the first light-transmitting member 23.

The KSAF-based phosphor may include the composition of the following Formula (I).

$$M_2[Si_pAl_qMn_rF_s] \qquad (I)$$

In Formula (I), M is an alkaline metal and may include at least K. Mn may be a tetravalent Mn ion. p, q, r, and s may satisfy $0.9 \le p+q+r \le 1.1$, $0 < q \le 0.1$, $0 < r \le 0.2$, and $5.9 \le s \le 6.1$. It is favorable to be $0.95 \le p+q+r \le 1.05$ or $0.97 \le p+q+r \le 1.03$, $0 < q \le 0.03$, $0.002 \le q \le 0.02$, or $0.003 \le q \le 0.015$, $0.005 \le r \le 0.15$, $0.01 \le r \le 0.12$, or $0.015 \le r \le 0.1$, and $5.92 \le s \le 6.05$ or $5.95 \le s \le 6.025$. For example, compositions of $K_2[Si_{0.946}Al_{0.005}Mn_{0.049}F_{5.995}]$, $K_2[Si_{0.942}Al_{0.008}Mn_{0.050}F_{5.992}]$, and $K_2[Si_{0.939}Al_{0.014}Mn_{0.047}F_{5.986}]$ are examples. According to such a KSAF-based phosphor, a red light emission that has high luminance and a narrow width at half maximum at the light emission peak wavelength can be obtained.

The cover member 24 is reflective to the light emitted by the light-emitting element 21. When a phosphor is included in the first light-transmitting member 23, the cover member 24 also is reflective to the light emitted by the phosphor.

The cover member 24 is, for example, a silicone resin, a phenol resin, an epoxy resin, or an acrylic resin that includes a light-diffusing agent made of particles of $TiO_2$, $SiO_2$, $Al_2O_3$, ZnO, glass, etc.

The cover member 24 covers the side surfaces of electrodes 26a and 26b. The lower surfaces of the electrodes 26a and 26b are not covered with the cover member 24 and are exposed from under the cover member 24. For example, the materials of the electrodes 26a and 26b are Cu. In a plan view as shown in FIG. 3B, the electrodes 26a and 26b are, for example, triangular. Also, in a plan view, the electrodes 26a and 26b may be circular, elliptical, or polygonal such as rectangular, etc.

The light source 20A can further include the first light-modulating member 28 according to the desired light distribution. The first light-modulating member 28 is located at the upper surface of the first light-transmitting member 23. Alternatively, the first light-modulating member 28 may not be located on the first light-transmitting member 23; in other words, the upper surface of the light source 20A can be formed of the upper surface of the first light-transmitting member 23.

The first light-modulating member 28 controls the amount and/or the emission direction of the light emitted from the upper surface of the first light-transmitting member 23. The first light-modulating member 28 is reflective and transmissive to the light emitted by the light-emitting element 21 and/or the phosphor. A portion of the light emitted from the upper surface of the first light-transmitting member 23 is reflected by the first light-modulating member 28, and another portion passes through the first light-modulating member 28. It is favorable for the transmittance of the first light-modulating member 28 to be, for example, not less than 1% and not more than 50%, and more favorably not less than 3% and not more than 30%. The luminance directly above the light source 20A can be reduced thereby, and the planar fluctuation of the luminance of the light-emitting device 300A can be reduced.

The first light-modulating member 28 can include a light-transmitting resin, a light-diffusing agent included in the light-transmitting resin, etc. The light-transmitting resin is, for example, a silicone resin, a phenol resin, an epoxy resin, or an acrylic resin. For example, particles of $TiO_2$, $SiO_2$, $Al_2O_3$, ZnO, glass, etc., are examples of the light-diffusing agent. The first light-modulating member 28 may be, for example, a dielectric multilayer film or a metal member of Al, Ag, etc.

As shown in FIG. 2, the light guide plate 10 includes a first major surface 11, a second major surface 12 positioned at the side opposite to the first major surface 11, and a light source placement portion 13. For example, the light source placement portion 13 is a through-hole that extends from the first major surface 11 to the second major surface 12. The light guide plate 10 is located on the support member 200 so that the second major surface 12 faces the first surface 201 of the support member 200.

The light guide plate 10 is transmissive to the light emitted by the light source 20A. The light that is emitted by the light source 20A includes at least the light emitted by the light-emitting element 21. When the light source 20A includes a phosphor, the light that is emitted by the light source 20A also includes the light emitted by the phosphor. It is favorable for the transmittance of the light guide plate 10 for the light from the light source 20A to be, for example, not less than 80%, and more favorably not less than 90%.

For example, a thermoplastic resin such as acrylic, polycarbonate, cyclic polyolefin, polyethylene terephthalate, polyester, or the like, a thermosetting resin such as epoxy, silicone, or the like, glass, etc., can be used as the material of the light guide plate 10.

It is favorable for the thickness of the light guide plate 10 to be, for example, not less than 200 μm and not more than 800 μm. The light guide plate 10 may include a single layer or may include a stacked body of multiple layers in the thickness direction. When the light guide plate 10 includes a stacked body, a transmissive bonding member may be located between the layers. The layers of the stacked body may include different types of major materials. For example, a thermoplastic resin such as acrylic, polycarbonate, cyclic polyolefin, polyethylene terephthalate, polyester, or the like, or a thermosetting resin such as epoxy, silicone, or the like can be used as the material of the bonding member.

As shown in FIG. 1, the light guide plate 10 is partitioned into multiple light-emitting regions 5 by a partitioning groove 14. The partitioning groove 14 is lattice-shaped in a plan view and partitions the light guide plate 10 so that at least one light source 20A is included in one light-emitting region 5. FIG. 1 shows the light-emitting device 300A that includes, for example, four light-emitting regions 5 partitioned into two rows and two columns. For example, each light-emitting region 5 that is partitioned by the partitioning groove 14 can be a driving unit of local dimming. The number of the light-emitting regions 5 included in the light-emitting device 300A is not limited to the number shown in FIG. 1.

For example, the shape of the light source placement portion 13 formed as the through-hole in the light guide plate 10 can be, for example, circular when viewed in the top-view shown in FIG. 1. Also, the shape of the light source placement portion 13 can be, for example, elliptic or polygonal such as triangular, rectangular, hexagonal, octagonal, etc., when viewed in top-view.

As shown in FIG. 2, the light source 20A is located on the support member 200 in the light source placement portion 13 of the light guide plate 10.

The light-emitting device 300A can further include a second light-transmitting member 71, a wavelength conversion member 72, a third light-transmitting member 73, and a second light-modulating member 74. The second light-transmitting member 71, the wavelength conversion member 72, and the third light-transmitting member 73 are located in the light source placement portion 13 of the light guide plate 10.

The second light-transmitting member 71 and the third light-transmitting member 73 are transmissive to the light emitted by the light source 20A and can include, for example, the same resin as the material of the light guide plate 10 or a resin that has a small refractive index difference with the material of the light guide plate 10.

The second light-transmitting member 71 is located between the side surface of the light source 20A and the side surface of the light source placement portion 13 of the light guide plate 10. It is favorable for the second light-transmitting member 71 to be located so that a space such as an air layer or the like is not formed between the second light-transmitting member 71 and the side surface of the light source 20A and between the second light-transmitting member 71 and the side surface of the light source placement portion 13. Thereby, the light from the light source 20A can be easily guided into the light guide plate 10.

The wavelength conversion member 72 covers the upper surface of the light source 20A. The wavelength conversion member 72 also covers the upper surface of the second light-transmitting member 71. The wavelength conversion member 72 is a transmissive resin member that includes a phosphor for color modulation of the light source 20A.

The third light-transmitting member 73 covers the upper surface of the wavelength conversion member 72. The upper surface of the third light-transmitting member 73 can be a flat surface. Alternatively, the upper surface of the third light-transmitting member 73 can be a concave or convex curved surface.

The second light-modulating member 74 is located on the third light-transmitting member 73. The second light-modulating member 74 is reflective and transmissive to the light emitted by the light source 20A. The second light-modulating member 74 can include a light-transmitting resin, a light-diffusing agent included in the light-transmitting resin, etc. The light-transmitting resin is, for example, a silicone resin, a phenol resin, an epoxy resin, or an acrylic resin. For example, particles of $TiO_2$, $SiO_2$, $Al_2O_3$, ZnO, glass, etc., are examples of the light-diffusing agent.

The second light-modulating member 74 can cover the entirety or a portion of the upper surface of the third light-transmitting member 73. Also, the second light-modulating member 74 can extend onto the upper surface of the third light-transmitting member 73 and the first major surface 11 of the light guide plate 10 at the periphery of the upper surface of the third light-transmitting member 73.

As shown in FIG. 1, the second light-modulating member 74 is located at a position that overlaps the light source 20A when viewed in top-view. In the example shown in FIG. 1, the shape of the second light-modulating member 74 is a rectangle that is larger than the rectangular light source 20A when viewed in top-view. The second light-modulating member 74 can be circular or polygonal such as triangular, hexagonal, octagonal, etc., when viewed in top-view.

The second light-modulating member 74 reflects a portion of the light emitted directly upward from the light source 20A and transmits another portion. Thereby, the luminance of the region directly above the light source 20A at the first major surface 11 of the light guide plate 10 that is the light-emitting surface (the light-emission surface) of the light-emitting device 300A can be prevented from becoming extremely high compared to the luminance of the other regions. That is, the uneven luminance of the light emitted from one light-emitting region 5 partitioned by the partitioning groove 14 can be reduced.

It is favorable for the thickness of the second light-modulating member 74 to be not less than 0.005 mm and not more than 0.2 mm, and more favorably not less than 0.01 mm and not more than 0.075 mm. It is favorable to set the reflectance of the second light-modulating member 74 to be less than the reflectance of the first light-modulating member 28 of the light source 20A, favorable to be, for example, not less than 20% and not more than 90% for the light from the light source 20A, and more favorably not less than 30% and not more than 85%.

The third light-transmitting member 73 is located between the second light-modulating member 74 and the first light-modulating member 28. The third light-transmitting member 73 has a higher transmittance for the light emitted by the light source 20A than the first and second light-modulating members 28 and 74. The transmittance of the third light-transmitting member 73 for the light emitted by the light source 20A can be in a range that is not more than 100%, and can be not less than 2 times and not more than 100 times the transmittance of the first light-modulating member 28 and the transmittance of the second light-modulating member 74. Thereby, the region directly above the light source 20A can be not too bright and not too dark; as a result, the uneven luminance in the light-emitting surface of each light-emitting region 5 can be reduced.

The second light-transmitting member 71 may be a single layer located in the through-hole that is the light source placement portion 13 without providing the wavelength conversion member 72 and the third light-transmitting member 73. In such a case, the second light-modulating member 74 is located on the second light-transmitting member 71. The second light-transmitting member 71 itself also can function as a wavelength conversion member by including a phosphor.

As shown in FIG. 2, the support member 200 includes a wiring substrate 50, a first bonding member 41, a light-reflecting member 42, and a second bonding member 43. The first bonding member 41, the light-reflecting member 42, and the second bonding member 43 are arranged in this order on the wiring substrate 50.

The first bonding member 41 is located between the wiring substrate 50 and the light-reflecting member 42 and bonds the wiring substrate 50 and the light-reflecting member 42. The second bonding member 43 is located between the light-reflecting member 42 and the second major surface 12 of the light guide plate 10 and bonds the light-reflecting member 42 and the light guide plate 10. The second bonding member 43 also is located below the light source placement portion 13, and the light source 20A is located on the second bonding member 43 in the light source placement portion 13. The upper surface of the second bonding member 43 includes the first surface 201 of the support member 200. The lower surface of the light source 20A contacts the upper surface of the second bonding member 43.

The second bonding member 43 is transmissive to the light emitted by the light source 20A. For example, an epoxy resin, an acrylic resin, a cyclic polyolefin resin, etc., are examples of the first and second bonding members 41 and 43.

The light-reflecting member 42 is located between the wiring substrate 50 and the second major surface 12 of the light guide plate 10 and between the wiring substrate 50 and the light source 20A. The light-reflecting member 42 between the wiring substrate 50 and the second major surface 12 and the light-reflecting member 42 between the wiring substrate 50 and the light source 20A may be a continuous body or separate bodies.

The light-reflecting member 42 is reflective to the light emitted by the light source 20A. The light-reflecting member 42 can include, for example, a resin member that includes many bubbles or a resin member that includes a light-diffusing agent. The material of the resin member is, for example, a polyethylene terephthalate (PET) resin, a cyclic polyolefin resin, an acrylic resin, a silicone resin, a urethane resin, an epoxy resin, etc. For example, $SiO_2$, $CaF_2$, $MgF_2$, $TiO_2$, $Nb_2O_5$, $BaTiO_3$, $Ta_2O_5$, $Zr_2O_3$, ZnO, $Y_2O_3$, $Al_2O_3$, MgO, $BaSO_4$, etc., can be used as the light-diffusing agent.

In the light-emitting device 300A, the light from the light source 20A that is guided through the light guide plate 10 toward the second major surface 12 side is reflected by the light-reflecting member 42 toward the first major surface 11 side that is the light-emitting surface of the light-emitting device 300A. In the light-emitting device 300A, the luminance of the light extracted from the first major surface 11 can be increased thereby.

The light from the light source 20A is guided through the light guide plate 10 toward the partitioning groove 14 while repeating total internal reflections between the light-reflecting member 42 and the first major surface 11 in the region between the light-reflecting member 42 and the first major surface 11. A portion of the light traveling toward the first major surface 11 is extracted out of the light guide plate 10 through the first major surface 11.

The wiring substrate 50 includes an insulating base and a wiring layer. At least one layer of the wiring layer is included in the thickness direction of the wiring substrate 50. The upper surface of the wiring substrate 50 is bonded to the first bonding member 41. The first connection portion 51*a* and a second connection portion 51*b* that are portions of the wiring layer are separated from each other at the lower surface of the wiring substrate 50. The lower surface of the wiring substrate 50 is covered with an insulating film 52. The first connection portion 51*a* and the second connection portion 51*b* are not covered with the insulating film 52 and are exposed from under the insulating film 52.

The pair of hole portions 210*a* and 210*b* that corresponds respectively to the positive electrode 26*a* and the negative electrode 26*b* of the light source 20A is located below the light source 20A.

The positive electrode 26*a* is positioned on one hole portion 210*a*. A first conductive member 61*a* is located in the hole portion 210*a*. The entire positive electrode 26*a* is positioned in the hole portion 210*a* in a plan view. At least a portion of the positive electrode 26*a* may be positioned in the hole portion 210*a*. The first conductive member 61*a* further extends to the first connection portion 51*a* at the second surface 202 side of the support member 200. The first conductive member 61*a* electrically connects the positive electrode 26*a* and the first connection portion 51*a*.

The negative electrode 26*b* is positioned on the other hole portion 210*b*. A second conductive member 61*b* is located in the hole portion 210*b*. The entire negative electrode 26*b* is positioned in the hole portion 210*b* in a plan view. At least a portion of the negative electrode 26*b* may be positioned in the hole portion 210*b*. The second conductive member 61*b* further extends to the second connection portion 51*b* at the second surface 202 side of the support member 200. The second conductive member 61*b* electrically connects the negative electrode 26*b* and the second connection portion 51*b*.

The first conductive member 61*a* and the second conductive member 61*b* are, for example, cured conductive pastes in which a conductive filler is dispersed in a resin. The first conductive member 61*a* and the second conductive member 61*b* can include, for example, metal particles of copper, silver, etc., as the filler. The filler is, for example, particles that are spherical, needle-shaped, flake-like, etc.

An insulating film 53 covers the first conductive member 61*a* and the second conductive member 61*b* at the lower surface of the insulating film 52. The insulating film 53 is formed to cover between the first conductive member 61*a* and the second conductive member 61*b* and to increase insulative properties between the first conductive member 61*a* and the second conductive member 61*b*.

Electrical power is supplied to the light-emitting element 21 of the light source 20A from an external circuit via the first and second connection portions 51*a* and 51*b* of the wiring substrate 50, the first conductive member 61*a*, the second conductive member 61*b*, the positive electrode 26*a*, and the negative electrode 26*b*.

Figure 4A:
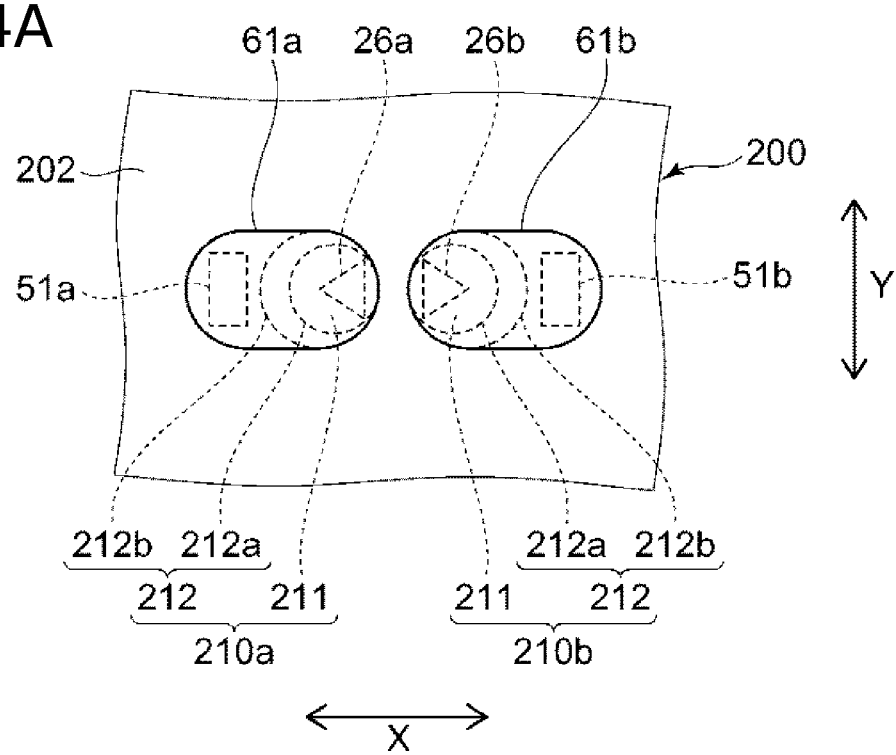
FIGS. 4A to 4D are bottom views showing an example of a lower region of the light source of the light-emitting device of the first embodiment of the invention.

FIG. 4A is a bottom view showing an example of the lower region of the light source 20A of the light-emitting device 300A shown in FIG. 2 (the insulating film 53 is not illustrated). When viewed in the bottom-view of FIG. 4A, the positive electrode 26*a*, the negative electrode 26*b*, the hole portions 210*a* and 210*b*, the first connection portion 51*a*, and the second connection portion 51*b* that are covered with the first and second conductive members 61*a* and 61*b* are illustrated by broken lines. This is similar for FIGS. 4B to 4D described below as well.

The first connection portion 51*a* and the second connection portion 51*b* are located in regions other than between the positive electrode 26*a* and the negative electrode 26*b* in a plan view. For example, the first connection portion 51*a*, the second connection portion 51*b*, the positive electrode 26*a*, and the negative electrode 26*b* are arranged in a first direction X, and the positive electrode 26*a* and the negative electrode 26*b* are positioned between the first connection portion 51*a* and the second connection portion 51*b*.

Each of the pair of hole portions 210*a* and 210*b* includes a first hole portion 211 and a second hole portion 212. The first hole portion 211 is open at the first surface 201 side of the support member 200, and the second hole portion 212 communicates with the first hole portion 211 and is open at the second surface 202 side of the support member 200.

The first hole portion 211 of each of the pair of hole portions 210*a* and 210*b* overlaps one of the positive electrode 26*a* connected with the first conductive member 61*a* or the negative electrode 26*b* connected with the second conductive member 61*b* in a plan view. The first hole portion 211 of one hole portion 210*a* overlaps the positive electrode 26*a* connected with the first conductive member 61*a* in a plan view. The first hole portion 211 of the other hole portion 210*b* overlaps the negative electrode 26*b* connected with the second conductive member 61*b* in a plan view.

The positive electrode 26*a* is connected with the first conductive member 61*a* located in one first hole portion 211 at the vicinity of the opening of the one first hole portion 211 at the first surface 201 side. The negative electrode 26*b* is connected with the second conductive member 61*b* located in the other first hole portion 211 at the vicinity of the opening of the other first hole portion 211 at the first surface 201 side.

The second hole portion 212 includes a first portion 212*a*, and a second portion 212*b* that communicates with the first portion 212*a*. The first portion 212*a* overlaps the first hole portion 211 in a plan view and communicates with the first hole portion 211.

The second portion 212b of the one hole portion 210a extends from the first portion 212a toward the first connection portion 51a side along the first direction X. The second portion 212b of the other hole portion 210b extends from the first portion 212a toward the second connection portion 51b side along the first direction X. The pair of second portions 212b extends in the opposite direction of the pair of first portions 212a. In the first direction X, the second portion 212b of the one hole portion 210a is separated from the first connection portion 51a, and the second portion 212b of the other hole portion 210b is separated from the second connection portion 51b.

The first hole portion 211 and the first and second portions 212a and 212b of the second hole portion 212 are, for example, circular in a plan view. The first hole portion 211 and the first portion 212a of the second hole portion 212 are circular and have substantially the same diameter. The second portion 212b of the second hole portion 212 is circular and has a larger diameter than the first hole portion 211 and the first portion 212a of the second hole portion 212.

The first hole portion 211 and the first and second portions 212a and 212b of the second hole portion 212 can be elliptic or polygonal such as triangular, rectangular, hexagonal, octagonal, etc., in a plan view.

A method for manufacturing the light-emitting device 300A will now be described with reference to FIGS. 5A to 13.

Figure 5A:
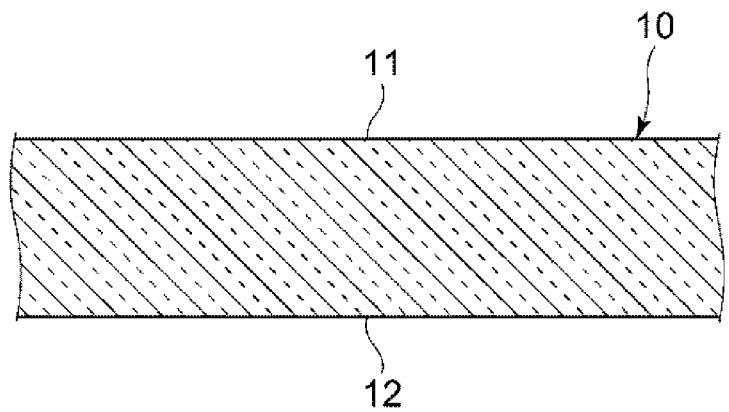
FIGS. 5A to 13 are cross-sectional views showing a method for manufacturing the light-emitting device of the first embodiment of the invention.

The method for manufacturing the light-emitting device 300A includes a process of preparing the light guide plate 10 shown in FIG. 5A. The light guide plate 10 includes the first major surface 11, and the second major surface 12 that is positioned at the side opposite to the first major surface 11.

Figure 5B:
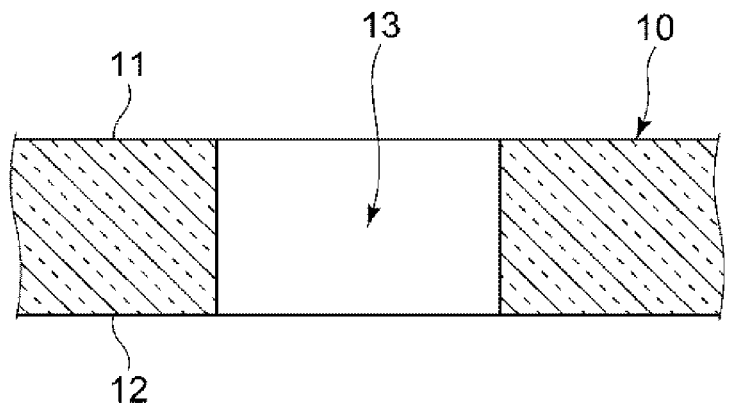

As shown in FIG. 5B, the light source placement portion 13 is formed in the light guide plate 10. The light source placement portion 13 is formed as a through-hole extending from the first major surface 11 to the second major surface 12 by, for example, drilling, punching, and laser patterning. The light guide plate 10 that includes the light source placement portion 13 may be prepared by procuring.

The method for manufacturing the light-emitting device 300A further includes a process of preparing the support member 200. The process of preparing the support member 200 includes a process of preparing the wiring substrate 50 shown in FIG. 6A. The first connection portion 51a, the second connection portion 51b, and the insulating film 52 of the wiring layer are located at the lower surface of the wiring substrate 50. The first connection portion 51a and the second connection portion 51b are located in the opening formed in the insulating film 52 and are exposed from under the insulating film 52.

Figure 6A:
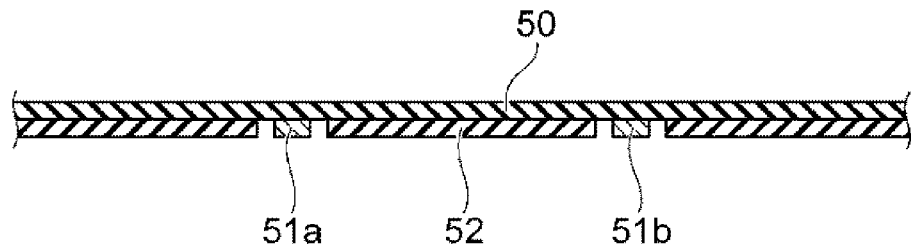
Figure 6B:
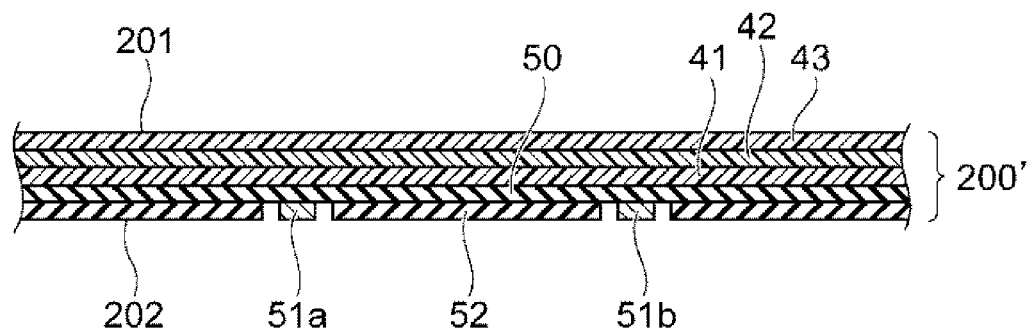

As shown in FIG. 6B, a support member 200' is obtained by stacking the first bonding member 41, the light-reflecting member 42, and the second bonding member 43 on the upper surface of the wiring substrate 50.

A thermosetting resin can be used as the first bonding member 41. The wiring substrate 50 and the light-reflecting member 42 can be fixed by the thermosetting resin by providing an uncured thermosetting resin between the wiring substrate 50 and the light-reflecting member 42 and by subsequently curing the uncured thermosetting resin. The thermosetting resin that is included in the first bonding member 41 is not particularly limited. For example, a known thermosetting resin such as a silicone resin, an epoxy resin, a phenol resin, a BT resin, a polyimide resin, an unsaturated polyester resin, etc., can be used. The first bonding member 41 may include a known light-diffusing agent such as $TiO_2$, $SiO_2$, $Al_2O_3$, $ZrO_2$, glass, etc. The luminance of the light extracted from the first major surface 11 of the light-emitting device can be increased by the first bonding member 41 including the light-diffusing agent. An OCA (Optical Clear Adhesive) can be used as the second bonding member 43. The OCA includes an acrylic pressure sensitive adhesive, a urethane pressure sensitive adhesive, a silicone pressure sensitive adhesive, etc. The sequence of the process of curing the uncured thermosetting resin (a first bonding member) located between the wiring substrate 50 and the light-reflecting member 42 is not particularly limited. When a thermosetting resin is used as the first bonding member 41 and an OCA is used as the second bonding member 43, it is favorable to bond the light-reflecting member 42 and an OCA (a second bonding member) after curing the uncured thermosetting resin (the first bonding member) located between the wiring substrate 50 and the light-reflecting member 42. The degradation of the OCA (the second bonding member) due to the heat when curing the thermosetting resin (the first bonding member) can be suppressed thereby. An OCA may be used as the first bonding member 41, and a thermosetting resin may be used as the second bonding member 43. Also, thermosetting resins or OCAs may be used as both of the first and second bonding members 41 and 43.

Figure 6C:
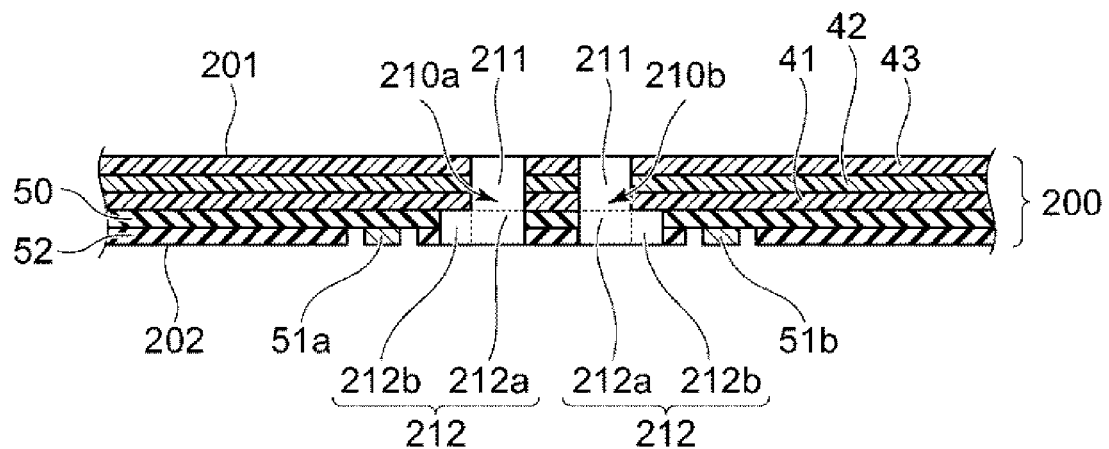

As shown in FIG. 6C, the hole portions 210a and 210b are formed in the support member 200'. The pair of hole portions 210a and 210b that extends through the second bonding member 43, the light-reflecting member 42, the first bonding member 41, the wiring substrate 50, and the insulating film 52 is formed, and the support member 200 is obtained.

As described above, each of the pair of hole portions 210a and 210b includes the first hole portion 211 and the second hole portion 212. The second hole portion 212 includes the first portion 212a that overlaps the first hole portion 211 in a plan view, and the second portion 212b that extends from the first portion 212a toward the connection portion 51a or 51b side. In FIG. 6C, the boundary between the first hole portion 211 and the first portion 212a of the second hole portion 212 and the boundary between the first portion 212a and the second portion 212b of the second hole portion 212 are illustrated by broken lines for convenience. For example, the first hole portion 211 and the second hole portion 212 can be formed by laser patterning.

When the hole portions 210a and 210b are formed by laser patterning, there are cases where a smear (an organic residue) is formed due to the heat of the laser light burning the material of the support member 200. When smears are formed at the peripheries of the edges of the openings of the hole portions 210a and 210b, the smears also may undesirably enter the hole portions 210a and 210b together with the conductive paste when the conductive paste is supplied to the hole portions 210a and 210b in a subsequent process, and may cause breakage and/or cracks when curing the conductive paste.

Therefore, for example, a protective film is adhered to the incident surface of the laser light of the support member 200' shown in FIG. 6B as a smear countermeasure. The material of the protective film is a material (e.g., polyethylene terephthalate, etc.) that has lower absorptivity of the laser light and less burning than the resin material of the support member 200' (e.g., polyimide, etc.). For example, in the state in which the protective film is adhered to the second surface 202 of the support member 200' shown in FIG. 6B, first, as shown in FIG. 6C, the second hole portion 212 is formed, and then the first hole portion 211 is formed, or the second portion 212b of the second hole portion 212 is formed after forming the first hole portion 211 and the first portion 212a of the second hole portion 212. Also, a protective film may be adhered to the first surface 201 at the side opposite to the incident surface (the second surface 202) of the laser light. By peeling the protective film from the support member 200 after forming the hole portions 210a and 210b, the smears that are formed at the peripheries of the edges of the hole portions 210a and 210b at the laser light incident surface side also are removed from the support member 200 together with the protective film.

As another example of a smear countermeasure that does not use a protective film, the smear is removed by performing a second laser light irradiation after a first laser light irradiation in which the hole portions 210a and 210b are formed. For example, a $CO_2$ laser is used in the first laser light irradiation. A $CO_2$ laser that has a lower laser light output and/or is more defocused than the first laser light irradiation is used in the second laser light irradiation. In the second laser light irradiation, the smear is removed from the support member 200 by sublimating by irradiating laser light on the peripheries of the edges of the hole portions 210a and 210b at the laser light incident surface side. The conditions of the second laser light irradiation such as the $CO_2$ laser output, etc., are set to have a heat amount that sublimates the smear formed in the first laser light irradiation while suppressing a new occurrence of smear due to the heat generation amount of the portion on which the second laser light irradiation is performed. Because the same $CO_2$ laser is used in the first laser light irradiation and the second laser light irradiation, the first laser light irradiation and the second laser light irradiation can be performed by using the same laser device as-is.

A $CO_2$ laser may be used in the first laser light irradiation, and a UV laser may be used in the second laser light irradiation. For the resin material of the support member 200, the absorptance for the UV laser is less than the absorptance for the $CO_2$ laser and does not easily generate heat that would cause a smear to occur. Therefore, by using a UV laser in the second laser light irradiation, the margin of the output conditions of the laser light can be wider than when a $CO_2$ laser is used in the second laser light irradiation.

Also, the second portion 212b of the second hole portion 212 can be formed by laser patterning after collectively forming the first hole portion 211 and the first portion 212a of the second hole portion 212 by punching or drilling.

The first hole portion 211 extends through the second bonding member 43, the light-reflecting member 42, and the first bonding member 41. The second hole portion 212 extends through the wiring substrate 50 and the insulating film 52 but does not reach the light-reflecting member 42.

In the example shown in FIG. 6C, the lower surface of the first bonding member 41 is exposed in the second portion 212b of the second hole portion 212. The lower surface of the first bonding member 41 is not limited thereto; it is sufficient for the depth from the second surface 202 of the second portion 212b to be such that the second bonding member 43 is not exposed. For example, the depth from the second surface 202 of the second portion 212b may be such that the light-reflecting member 42 is exposed. The depth from the second surface 202 of the second portion 212b may be such that the wiring substrate 50 is exposed.

In the example shown in FIG. 6C, the surface of the support member 200 exposed in the second portion 212b is a plane. The surface of the support member 200 exposed in the second portion 212b is not limited to a plane and may be a curved surface (e.g., a concave surface that is concave from the second surface 202 side) or may be a combination of a plane and a curved surface. Thus, breakage of the conductive members 61a and 61b can be suppressed by the surface exposed in the second portion 212b including a curved surface. Also, the curved surface of the support member 200 exposed in the second portion 212b may be a curved surface straddling the wiring substrate 50 and the first bonding member 41 or a curved surface straddling the wiring substrate 50, the first bonding member 41, and the light-reflecting member 42.

To prevent the reduction of the luminance due to the reduction of the surface area of the light-reflecting member 42 at the lower region of the light source 20A and the leakage of the light from the light source 20A toward the wiring substrate 50 side, it is favorable for the second portion 212b of the second hole portion 212 not to reach a depth that removes the entire light-reflecting member 42 in the thickness direction and exposes the second bonding member 43. In other words, it is sufficient for at least a portion of the light-reflecting member 42 to remain between the second portion 212b and the light source 20A. However, light easily escapes toward the wiring substrate 50 side when the light-reflecting member 42 is thin; therefore, it is more favorable for the second portion 212b to have a depth that does not reach the light-reflecting member 42.

Figure 7:
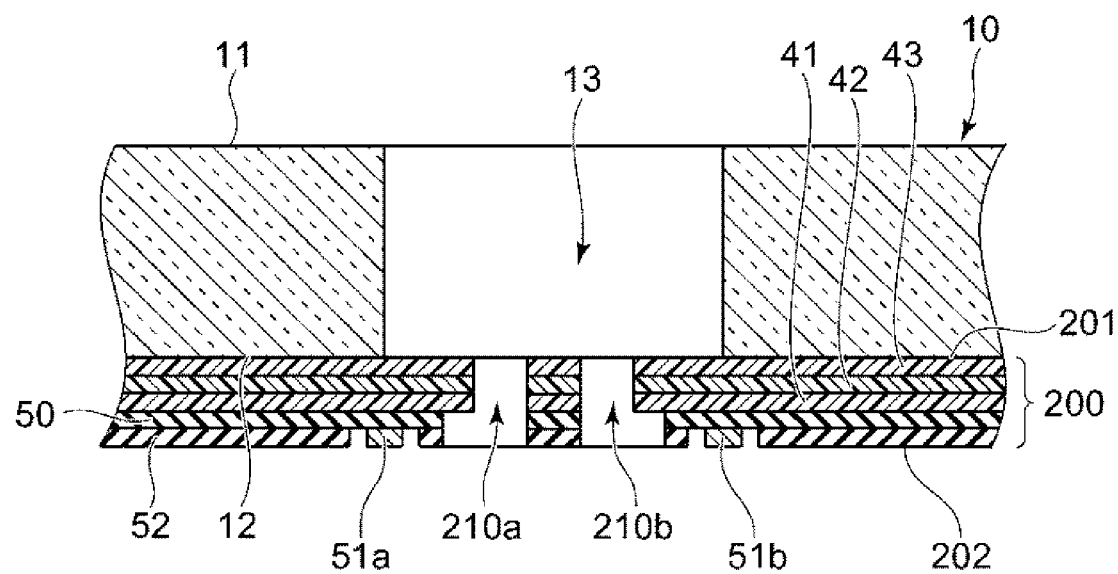

As shown in FIG. 7, the light guide plate 10 is located on the support member 200. The second major surface 12 of the light guide plate 10 faces the upper surface of the second bonding member 43 forming the first surface 201 of the support member 200 and is bonded to the upper surface of the second bonding member 43.

The hole portions 210a and 210b that are formed in the support member 200 overlap the light source placement portion 13 formed in the light guide plate 10 and communicate with the light source placement portion 13. The pair of hole portions 210a and 210b overlaps one light source placement portion 13.

Figure 8:
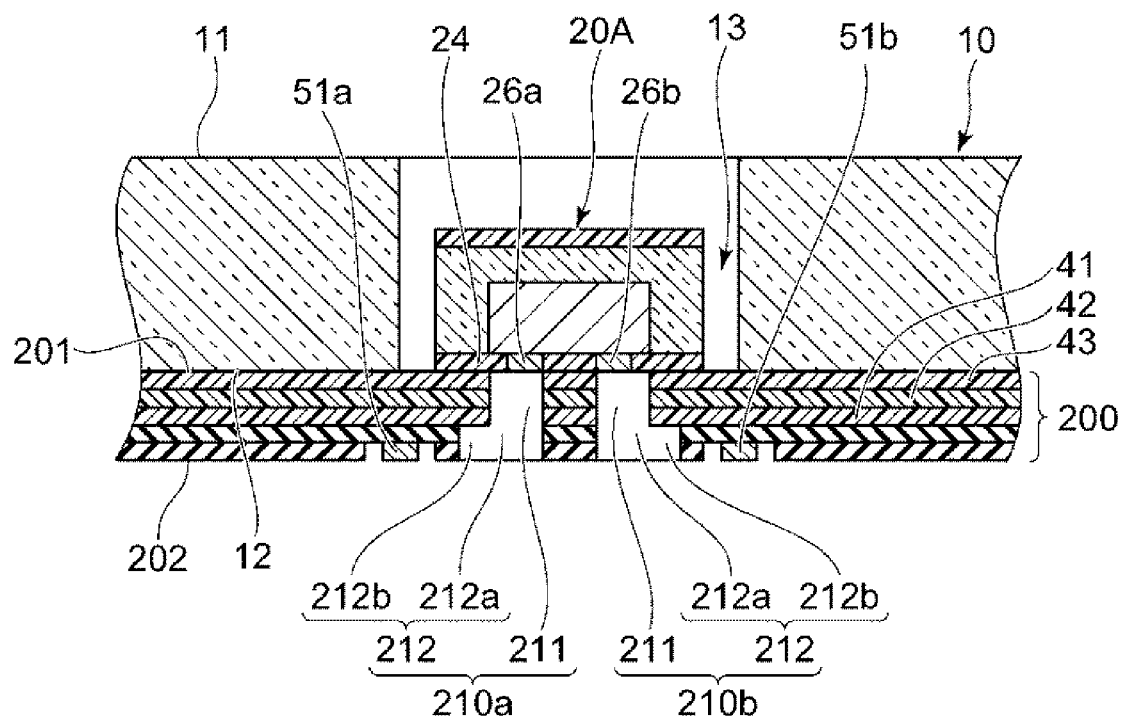

After the light guide plate 10 is disposed on the support member 200, the light source 20A is disposed in the light source placement portion 13 of the light guide plate 10 as shown in FIG. 8. The lower surface of the light source 20A is bonded to the upper surface of the second bonding member 43 exposed in the light source placement portion 13. The positive electrode 26a of the light source 20A is aligned with the one hole portion 210a, and the negative electrode 26b is aligned with the other hole portion 210b. The openings of the hole portions 210a and 210b at the first surface 201 side of the support member 200 (the openings of the first hole portions 211) are plugged by the light source 20A.

Figure 9:
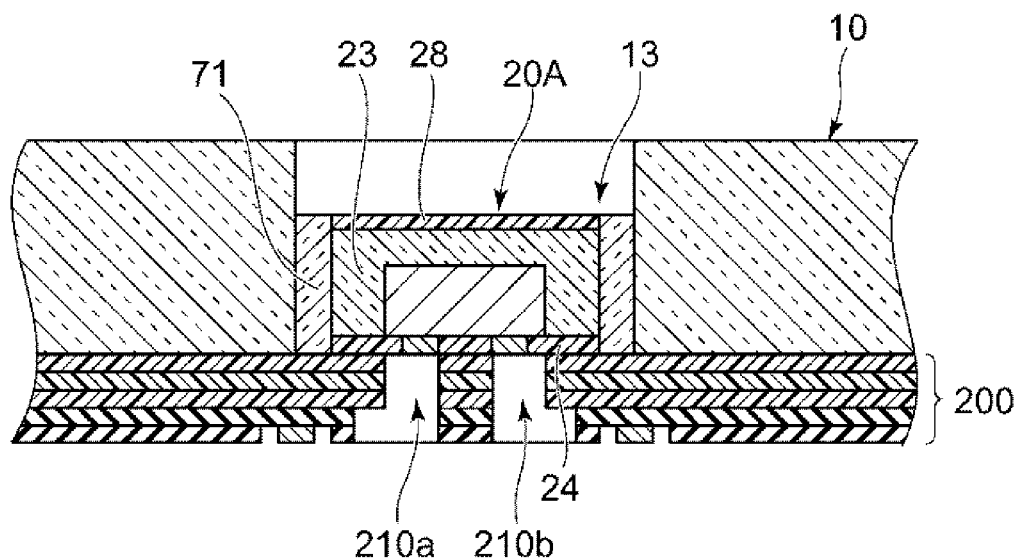

After disposing the light source 20A on the support member 200, the second light-transmitting member 71 is formed in the light source placement portion 13 of the light guide plate 10 as shown in FIG. 9. The second light-transmitting member 71 is formed between the side surface of the light source 20A and the side surface of the light source placement portion. The upper surface of the light source 20A is exposed from under the second light-transmitting member 71. For example, the second light-transmitting member 71 is formed by supplying a liquid light-transmitting resin to the light source placement portion 13 and by subsequently curing by heating. For example, at this time, the heating temperature is not less than 100° C. and not more than 120° C., and the heating time is not less than 0.5 hours and not more than 1 hour. The light source 20A is fixed with respect to the light guide plate 10 by the second light-transmitting member 71.

After forming the second light-transmitting member 71, a conductive paste is supplied to the hole portions 210a and 210b. For example, the conductive paste is supplied to the hole portions 210a and 210b by a method such as printing, dispensing, etc. Although the openings of the hole portions 210a and 210b are oriented downward in the state shown in FIG. 9, the conductive paste is supplied to the hole portions 210a and 210b in a state in which the openings of the hole portions 210a and 210b are oriented upward by inverting the vertical positions from this state.

Also, the second light-transmitting member 71 may be formed in the light source placement portion 13 after supplying the conductive paste to the hole portions 210a and 210b and curing.

Figure 10:
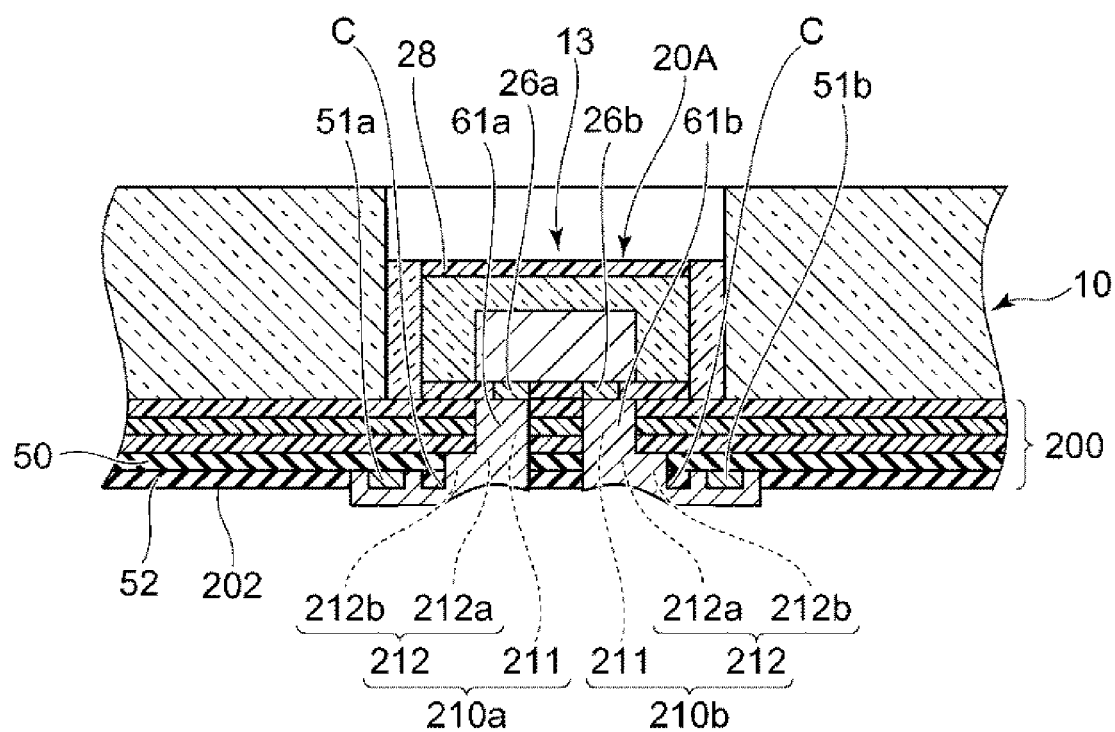

For example, by thermally curing the conductive paste supplied to the hole portions 210a and 210b, the first conductive member 61a that is connected with the positive electrode 26a of the light source 20A and the second conductive member 61b that is connected with the negative electrode 26b of the light source 20A are formed as shown in FIG. 10. For example, at this time, the heating temperature is not less than 100° C. and not more than 120° C., and the heating time is not less than 0.5 hours and not more than 1 hour. The conductive paste may be supplied to the hole portions 210a and 210b and may be cured while pressurizing to not less than 5 and not more than 10 atmospheres.

When curing the conductive paste, it is favorable to cure while pressurizing. Bubbles in the first conductive member 61a and/or the second conductive member 61b can be suppressed thereby. For example, the bubbles that entered the conductive paste when supplying the conductive paste to the hole portions 210a and 210b can be emitted from the conductive paste by curing while pressurizing the conductive paste. By suppressing the bubbles in the first conductive member 61a and/or the second conductive member 61b, the reliability of the first conductive member 61a and/or the second conductive member 61b in the electrical connection is increased. Also, the bubbles that are positioned between the conductive paste and the first bonding member, the light-reflecting member, and/or the second bonding member can be emitted outside via the conductive paste by curing while pressurizing the conductive paste. The adhesion between the first conductive member 61a and/or the second conductive member 61b and the first bonding member, the light-reflecting member, and/or the second bonding member can be improved thereby. When the first bonding member and/or the second bonding member include bubbles before curing the conductive paste, the bubbles can be emitted outside via the conductive paste by curing while pressurizing the conductive paste. The bonding force of the first bonding member and/or the second bonding member is easily improved thereby. When the conductive paste includes metal particles and a resin, the volume of the resin can be reduced by curing while pressurizing the conductive paste. The proportion of the volume of the metal particles with respect to the first conductive member 61a can be increased thereby; therefore, the reliability of the first conductive member 61a of the electrical connection is increased. Similarly, by curing while pressurizing the conductive paste, the proportion of the volume of the metal particles with respect to the second conductive member 61b can be increased. The reliability of the second conductive member 61b in the electrical connection is increased thereby. Generally, the pressurizing changes the volume of the metal particles less easily than the resin. By reducing the volume of the resin included in the conductive paste, a recess is formed in the surface of the first conductive member 61a and/or the second conductive member 61b positioned at the side opposite to the light guide plate 10 as shown in FIG. 10. The temperature when curing the conductive paste is not particularly limited. It is favorable for the temperature when curing the conductive paste to be, for example, not less than 40° C. and not more than 130° C. The pressure when curing the conductive paste is not particularly limited. It is favorable for the pressure when curing the conductive paste to be, for example, not less than 0.15 MPa and not more than 1 MPa. It is favorable for the conductive paste to include an organic solvent. When curing the conductive paste, bubbles in the conductive paste are more easily emitted from the conductive paste due to the volatilized organic solvent. The amount of the solvent included in the conductive paste is not particularly limited. It is favorable for the amount of the solvent included in the conductive paste to be, for example, not less than 0.1 wt % and not more than 10 wt %. The material of the organic solvent included in the conductive paste is not particularly limited. The material of the organic solvent included in the conductive paste can include, for example, a known material such as methanol, ethanol, propylene glycol monomethyl ether, propylene glycol monoethyl ether, dipropylene glycol monomethyl ether, cyclopentanone, cyclohexanone, γ-butyrolactone, etc.

The first conductive member 61a that is connected with the first connection portion 51a and the second conductive member 61b that is connected with the second connection portion 51b are formed at the second surface 202 side by supplying the conductive paste to the second surface 202 side of the support member 200 as well.

According to the embodiment, the volume of the hole portions 210a and 210b at the second surface 202 side can be increased by setting the second portion 212b of the second hole portion 212 that is open at the second surface 202 side of the support member 200 to extend further than the first hole portion 211 toward the connection portion 51a or 51b side. Accordingly, even when the volume of the conductive paste supplied to the second portion 212b is increased and curing shrinkage occurs, a sufficient amount of conductive paste can remain at the portion that covers a corner C between the second surface 202 and the side surface of the second portion 212b. The breakage of the conductive members 61a and 61b after curing can be prevented thereby, and the reliability of the electrical connection between the light source 20A and the wiring layer of the support member 200 can be increased.

When the volume of the first conductive member 61a connected with the positive electrode 26a of the light source 20A is less than a design value (a target value), the conductive paste may be supplied to contact the first conductive member 61a. The volume of the conductive member that is connected with the positive electrode 26a of the light source 20A can be increased thereby. In the specification, a conductive first conductive portion that is formed of the conductive paste supplied to the hole portion 210a and a conductive second conductive portion that is formed of the conductive paste electrically connected with the first conductive portion are called the first conductive member 61a. Similarly, a conductive third conductive portion that is formed of the conductive paste supplied to the hole portion 210b and a conductive fourth conductive portion that is formed of the conductive paste electrically connected with the third conductive portion are called the second conductive member 61b.

When the volume of the first conductive member 61a that is formed is less than the design value (the target value), the volume of the first conductive member 61a can be increased by supplying the conductive paste to be electrically connected with the first conductive member 61a. Thereby, the volume of the first conductive member 61a can approach the design value (the target value). The conductive paste may be supplied one time, two times, or more to be electrically connected with the first conductive member 61a. Similarly, when the volume of the second conductive member 61b that is formed is less than the design value (the target value), the volume of the second conductive member 61b can be increased by supplying the conductive paste to be electrically connected with the second conductive member 61b. The conductive paste may be supplied one time, two times, or more to be electrically connected with the second conductive member 61b.

When the volume of the first conductive member 61a that is formed is greater than the design value (the target value), a portion of the first conductive member 61a may be removed. Thereby, the volume of the first conductive member 61a can approach the design value (the target value). Similarly, when the volume of the second conductive member 61b that is formed is greater than the design value (the target value), a portion of the second conductive member 61b may be removed. A known method such as irradiating laser light, cutting, etc., can be used as the method of removing the portion of the first conductive member 61a and/or the second conductive member 61b.

The diameter (or the width) of the first hole portion 211 that extends through the light-reflecting member 42 is less than the diameter (or the width) of the second hole portion 212; therefore, the decrease of the luminance due to the decrease of the surface area of the light-reflecting member 42 in the lower region of the light source 20A can be prevented.

As shown in FIG. 4A, the first conductive member 61a overlaps and covers the positive electrode 26a, the hole portion 210a, and the first connection portion 51a in a plan view. In a plan view, the second conductive member 61b is separated from the first conductive member 61a, and overlaps and covers the negative electrode 26b, the hole portion 210b, and the second connection portion 51b.

To increase the volume of the conductive paste supplied to the second portion 212b, it is favorable for the width (the maximum width) of the second portion 212b in a second direction Y orthogonal to the first direction X to be greater than the width (the maximum width) in the second direction Y of the first portion 212a. For example, the first portion 212a and the second portion 212b are circular in a plan view, and the diameter of the second portion 212b is greater than the diameter of the first portion 212a.

Figure 11:
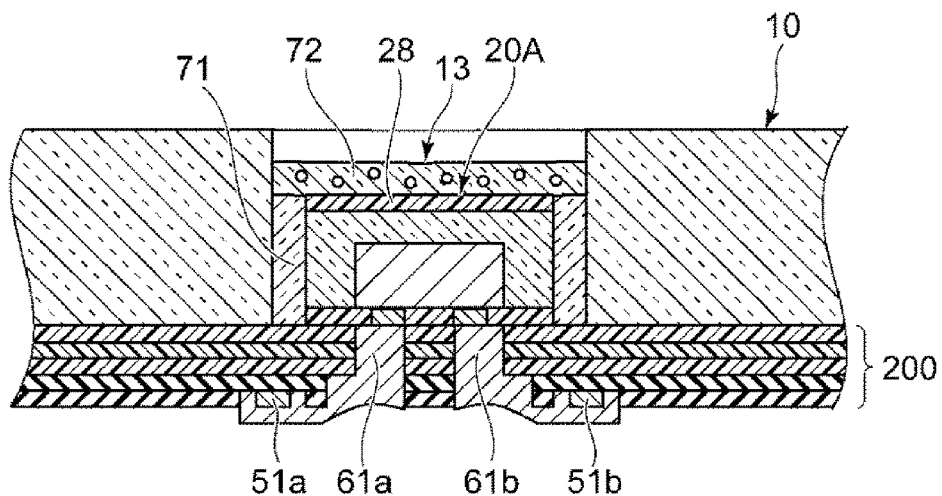

After forming the first conductive member 61a and the second conductive member 61b, the wavelength conversion member 72 is formed on the light source 20A in the light source placement portion 13 and on the second light-transmitting member 71 as shown in FIG. 11. For example, the wavelength conversion member 72 is formed by supplying a liquid resin that includes a phosphor to the light source placement portion 13 and by subsequent thermal curing. For example, at this time, the heating temperature is not less than 80° C. and not more than 120° C., and the heating time is not less than 5 minutes and not more than 30 minutes.

Figure 12:
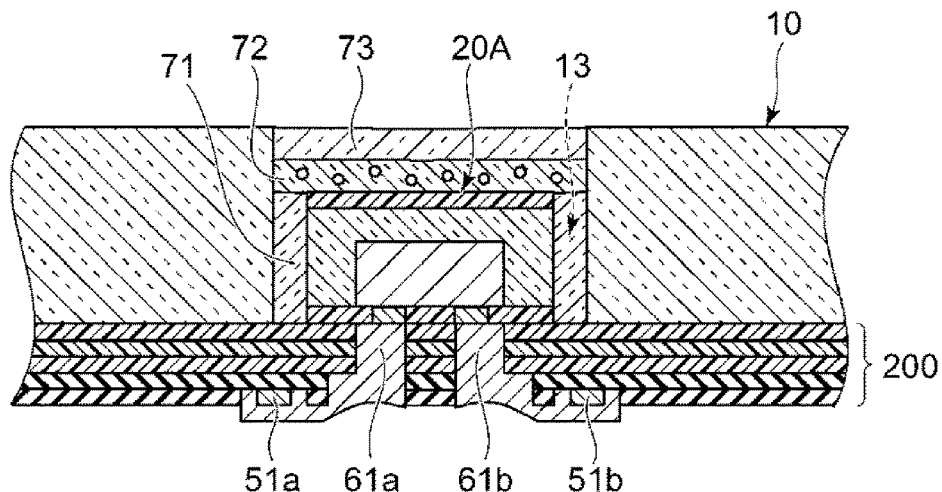

After forming the wavelength conversion member 72, the third light-transmitting member 73 is formed on the wavelength conversion member 72 in the light source placement portion 13 as shown in FIG. 12. For example, the third light-transmitting member 73 is formed by supplying a liquid resin onto the wavelength conversion member 72 and by subsequent thermal curing. For example, at this time, the heating temperature is not less than 80° C. and not more than 120° C., and the heating time is not less than 5 minutes and not more than 30 minutes.

Only the second light-transmitting member 71 may be provided in the light source placement portion 13. In such a case, the second light-transmitting member 71 can function as a wavelength conversion member by the second light-transmitting member 71 including a phosphor.

Figure 13:
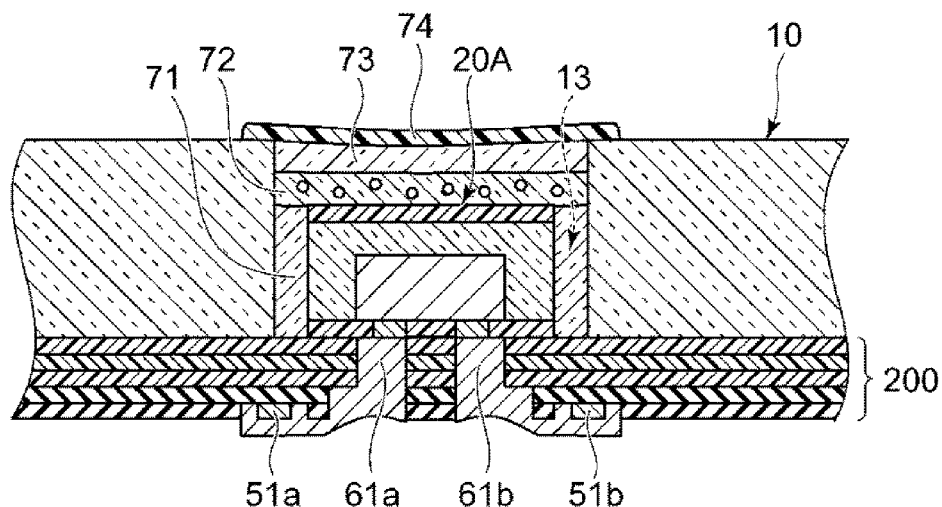

After forming the third light-transmitting member 73, the second light-modulating member 74 is formed on the third light-transmitting member 73 as shown in FIG. 13. For example, the second light-modulating member 74 is formed by supplying a liquid resin that includes a light-diffusing agent onto the third light-transmitting member 73 and by subsequent thermal curing. For example, at this time, the heating temperature is not less than 80° C. and not more than 120° C., and the heating time is not less than 5 minutes and not more than 30 minutes.

After forming the second light-modulating member 74, the insulating film 53 is formed at the second surface 202 of the support member 200 to cover the first conductive member 61a and the second conductive member 61b as shown in FIG. 2. For example, the insulating film 53 is formed by a method such as printing, potting, spraying, inkjet, bonding a resin sheet, etc.

Figure 4B:
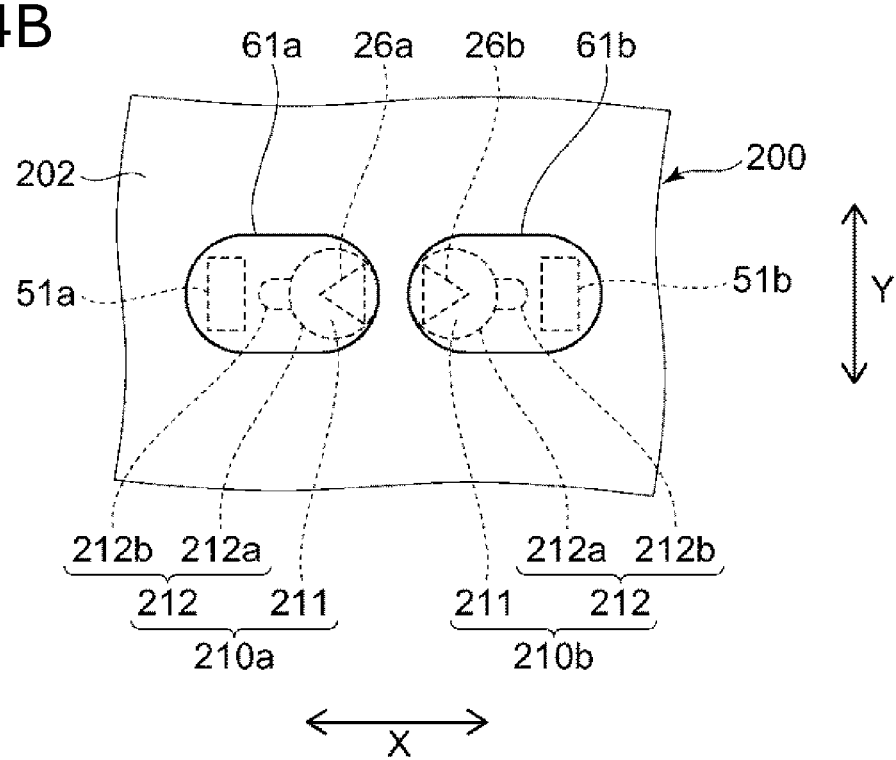
Figure 4C:
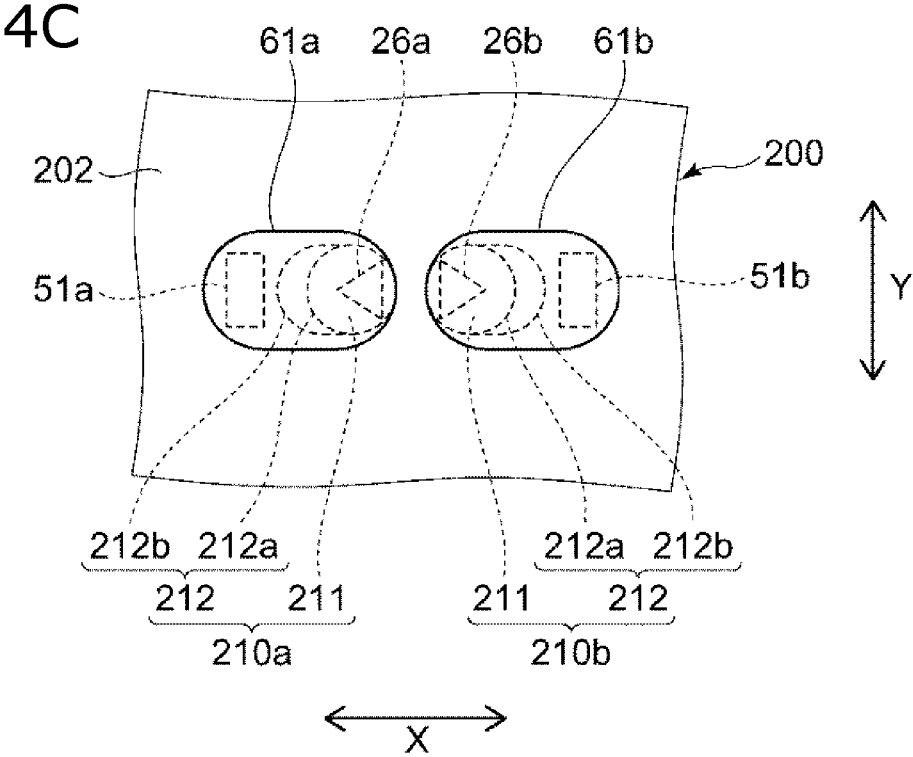
Figure 4D:
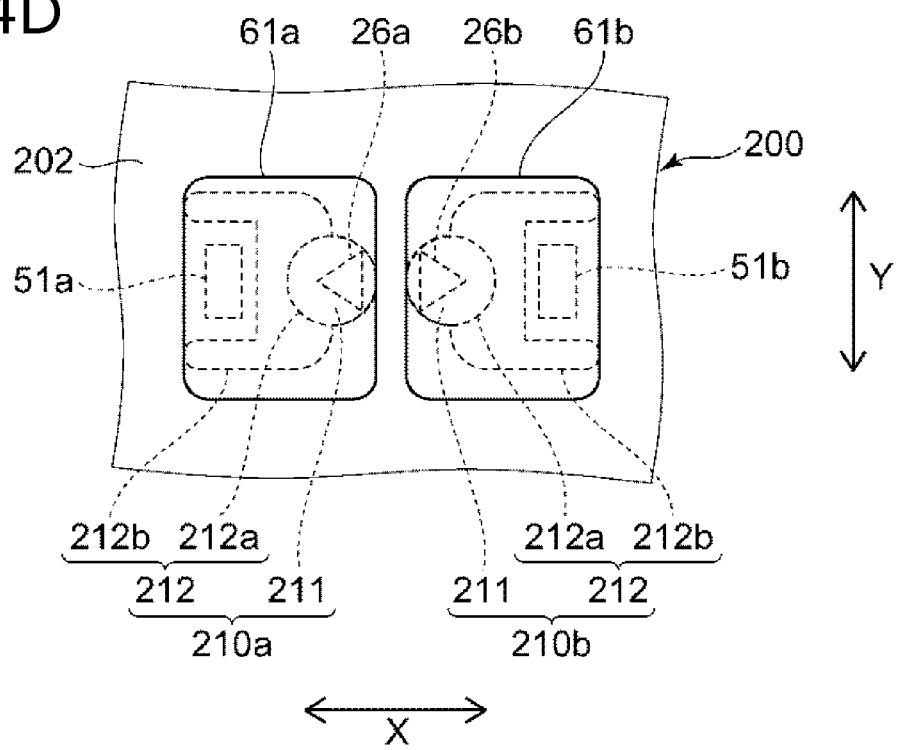

FIGS. 4B to 4D are bottom views showing examples of the lower region of the light source 20A similar to FIG. 4A.

In the example shown in FIG. 4B, the maximum width in the second direction Y of the second portion 212b is less than the maximum width (the diameter) in the second direction Y of the first portion 212a. Thereby, the volume of the conductive paste can be reduced so that breakage of the conductive members 61a and 61b does not occur after curing, and the patterning time of the second portion 212b can be reduced; therefore, the reliability of the electrical connection between the light source and the wiring layer of the support member can be inexpensively increased.

In the example shown in FIG. 4C, the diameter or the maximum width in the second direction Y of the second portion 212b is equal to the diameter or the maximum width in the second direction Y of the first portion 212a. The first portion 212a and the second portion 212b are linked in a straight line or by an obtuse angle, and an acute corner that can be a breakage starting point is not formed where the first portion 212a and the second portion 212b are linked. Breakage of the conductive members 61a and 61b does not easily occur thereby; therefore, the reliability of the electrical connection between the light source and the wiring layer of the support member can be increased.

In the example shown in FIG. 4D, the maximum width in the second direction Y of the second portion 212b is greater than the maximum width (the diameter) in the second direction Y of the first portion 212a. The second portion 212b of the second hole portion 212 of the one hole portion 210a extends to a position overlapping the first connection portion 51a in the second direction Y. The second portion 212b of the second hole portion 212 of the other hole portion 210b extends to a position overlapping the second connection portion 51b in the second direction Y. The second portion 212b is separated from the connection portions 51a and 51b in the second direction Y. According to the second portion 212b shown in FIG. 4D, the volume of the conductive paste supplied to the second portion 212b can be increased. Also, the outer perimeter length of the second portion 212b can be further increased, and the likelihood of the light source being unlit due to breakage of the conductive members 61a and 61b at the outer perimeter portion of the second portion 212b can be reduced. Therefore, the reliability of the electrical connection between the light source and the wiring layer of the support member can be further increased.

Second Embodiment

FIGS. 14A to 14D are bottom views showing examples of the lower region of the light source 20A of the light-emitting device 300A. When viewed in bottom-view in FIGS. 14A to 14D, the light source 20A, the light-emitting element 21, the positive electrode 26a, the negative electrode 26b, the hole portions 210a and 210b, the first connection portion 51a, and the second connection portion 51b that are covered with the insulating film 52, the first conductive member 61a, and the second conductive member 61b are illustrated by broken lines.

In FIGS. 14A to 14D, a portion of the second portion 212b of the second hole portion 212 of one hole portion 210a extends toward the first connection portion 51a side, i.e., in the first direction, from the first portion 212a overlapping the first hole portion 211. A portion of the second portion 212b of the second hole portion 212 of the other hole portion 210b extends toward the second connection portion 51b side, i.e., in the first direction, from the first portion 212a overlapping the first hole portion 211.

In FIGS. 14A to 14D, the first connection portion 51a and the second connection portion 51b extend in a direction crossing the direction connecting the positive electrode 26a and the negative electrode 26b with the shortest distance. A portion of the first connection portion 51a is exposed from under the insulating film 52 in a first opening 52a formed in the insulating film 52, and another portion of the first connection portion 51a is covered with the insulating film 52. The portion of the first connection portion 51a is connected with the first conductive member 61a in the first opening 52a. Also, a portion of the second connection portion 51b is exposed from under the insulating film 52 in a second opening 52b formed in the insulating film 52, and another portion of the second connection portion 51b is covered with the insulating film 52. The portion of the second connection portion 51b is connected with the second conductive member 61b in the second opening 52b.

Figure 14A:
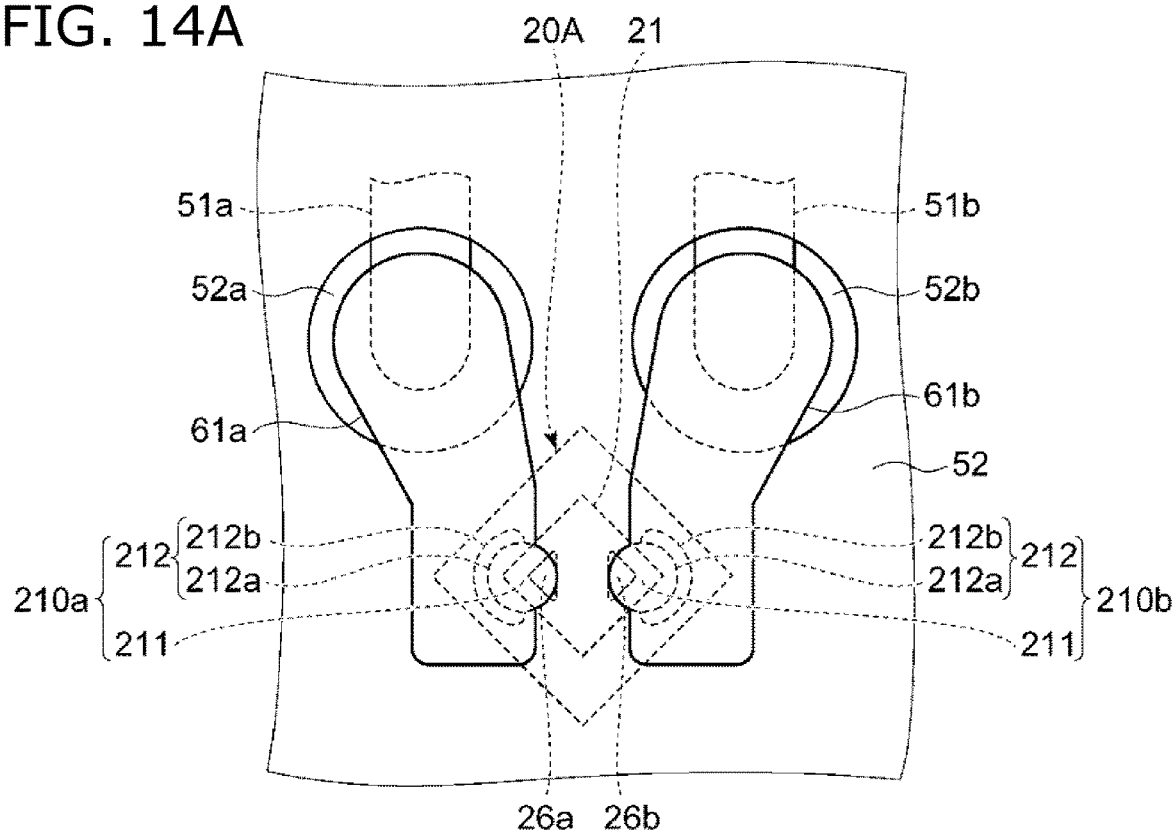
FIGS. 14A to 14F are bottom views showing an example of a lower region of the light source of the light-emitting device of a second embodiment of the invention.

In the example shown in FIG. 14A, the first hole portion 211 and the first portion 212a of the second hole portion 212 are circular and have substantially the same diameter in a plan view. The second portion 212b of the second hole portion 212 is located along a portion of the outer perimeter of the first portion 212a in a plan view.

When multiple light sources 20A are provided on the support member 200, multiple pairs of the hole portions 210a and 210b are provided. In such a case, the conductive paste is disposed along the direction in which the multiple pairs of hole portions 210a and 210b are arranged at a prescribed spacing based on the design value of the spacing of the multiple pairs of hole portions 210a and 210b. However, there are cases where the spacing of the multiple pairs of hole portions 210a and 210b deviates from the design value when manufacturing. The deviation amount from the design value when manufacturing is, for example, not more than about 150 μm. In such a case, the positions of the hole portions 210a and 210b and the conductive members 61a and 61b may be undesirably shifted.

Figure 14B:
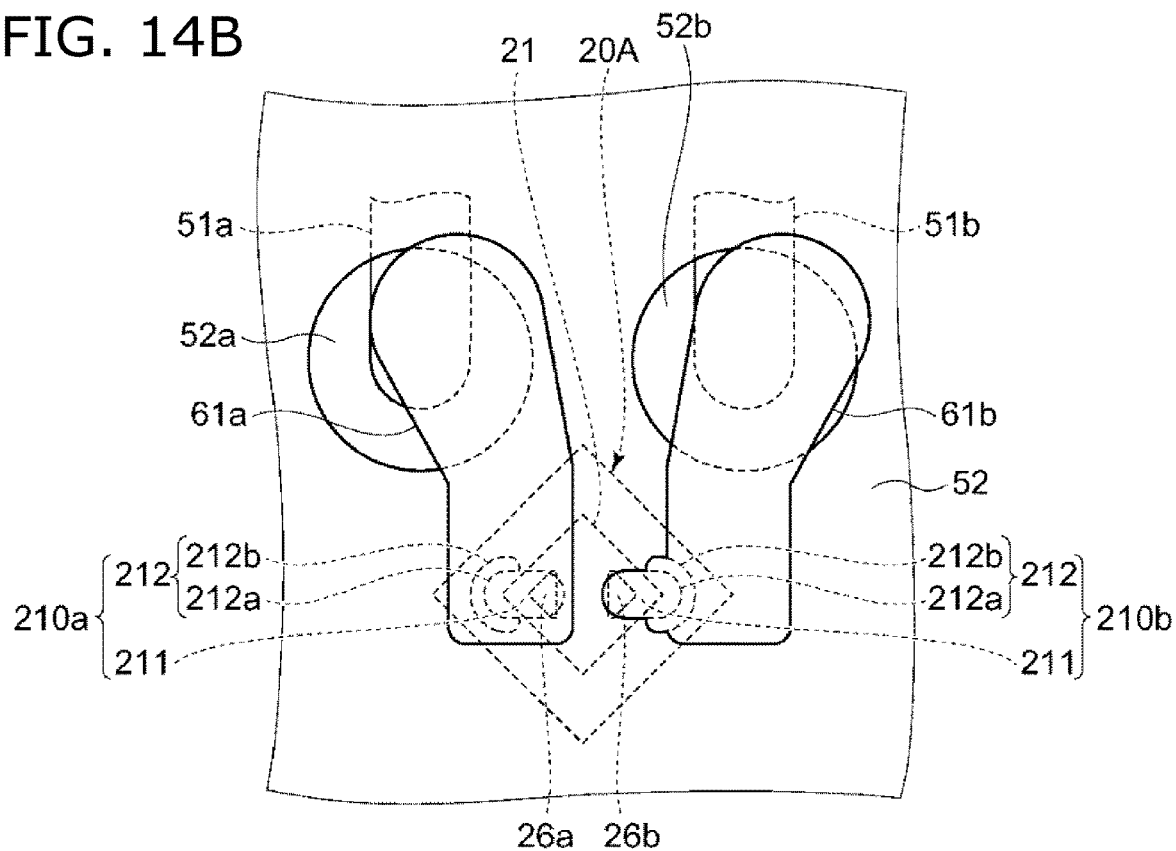

In the example shown in FIG. 14B, the first hole portion 211 and the first portion 212a of the second hole portion 212 overlapping the first hole portion 211 are elliptic or oval in a plan view. The major axes of the ellipse or the oval of the first hole portion 211 and the first portion 212a extend in a direction connecting the positive electrode 26a and the negative electrode 26b with the shortest distance. The second portion 212b is formed along a portion of the outer perimeter of the first portion 212a in a plan view. In other words, compared to the example shown in FIG. 14A, the opening shapes of the hole portions 210a and 210b at the second surface 202 side of the support member 200 are long in the lateral direction (the direction connecting the positive electrode 26a and the negative electrode 26b with the shortest distance). Thereby, when the multiple pairs of hole portions 210a and 210b are arranged in the lateral direction recited above, even when the spacing of the multiple pairs of hole portions 210a and 210b deviates from the design value when manufacturing, the supply position of the conductive paste easily overlaps at least a portion of the opening at the second surface 202 side of the hole portions 210a and 210b. The conductive paste flows into and fills the interiors of the hole portions 210a and 210b from locations overlapping the hole portions 210a and 210b.

Figure 14C:
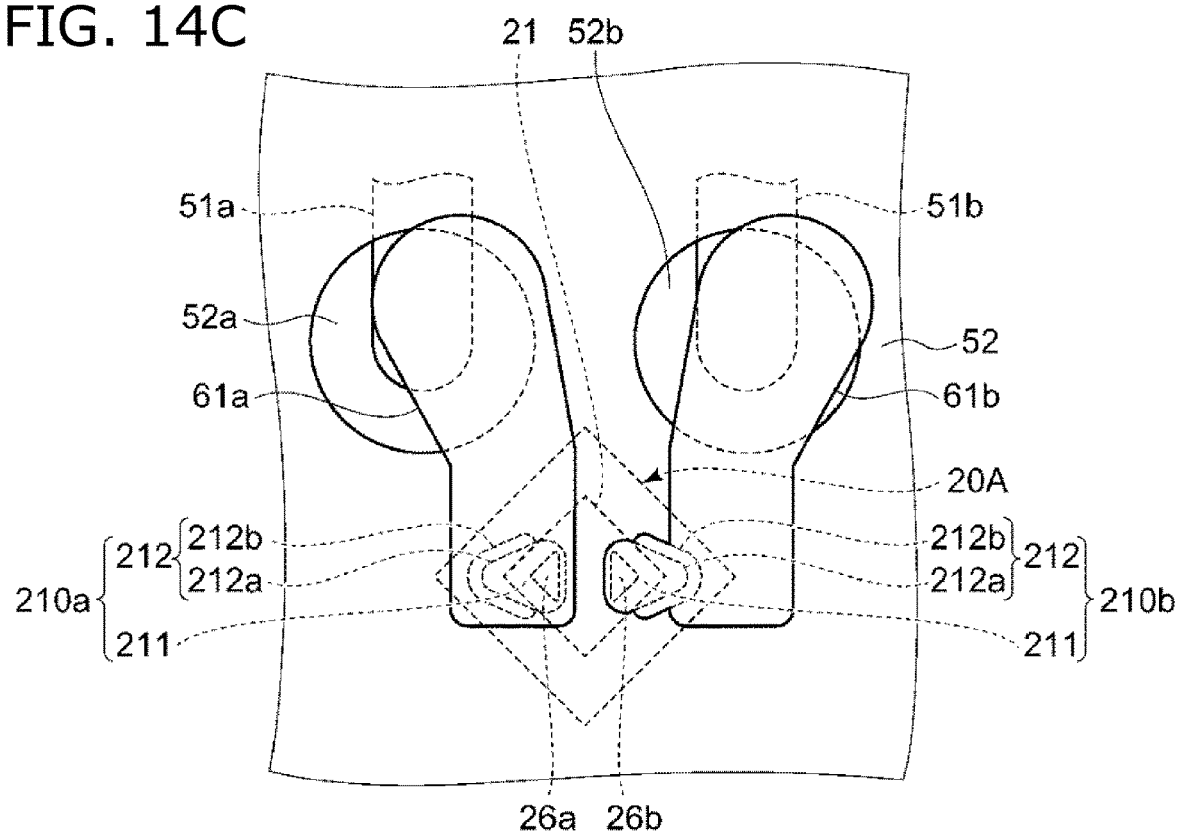

In the example shown in FIG. 14C as well, similarly to the example shown in FIG. 14B, compared to the example shown in FIG. 14A, the opening shapes of the hole portions 210a and 210b at the second surface 202 side of the support member 200 are long in the lateral direction recited above. Furthermore, in the example shown in FIG. 14C, the width (the width in the vertical direction in FIG. 14C) of the first hole portion 211 that overlaps the electrodes 26a and 26b and is open at the first surface 201 side of the support member 200 decreases from the region overlapping the electrodes 26a and 26b toward the region connected to the second portion 212b. Thereby, the conductive members 61a and 61b in the first hole portions 211 that do not overlap the light source 20A are not visible from the light-emitting surface (the first major surface 11 of the light guide plate 10) side while increasing the contact area between the conductive members 61a and 61b and the electrodes 26a and 26b.

In the examples shown in FIGS. 14A to 14C, the arrangement relationship in a plan view between the light guide plate 10 and the rectangular light source 20A is as shown in FIG. 1. In other words, in a plan view, the corners of the light source 20A do not face the corners of the light-emitting region 5 partitioned by the partitioning groove 14, and face the side portions of the light-emitting region 5.

Figure 14D:
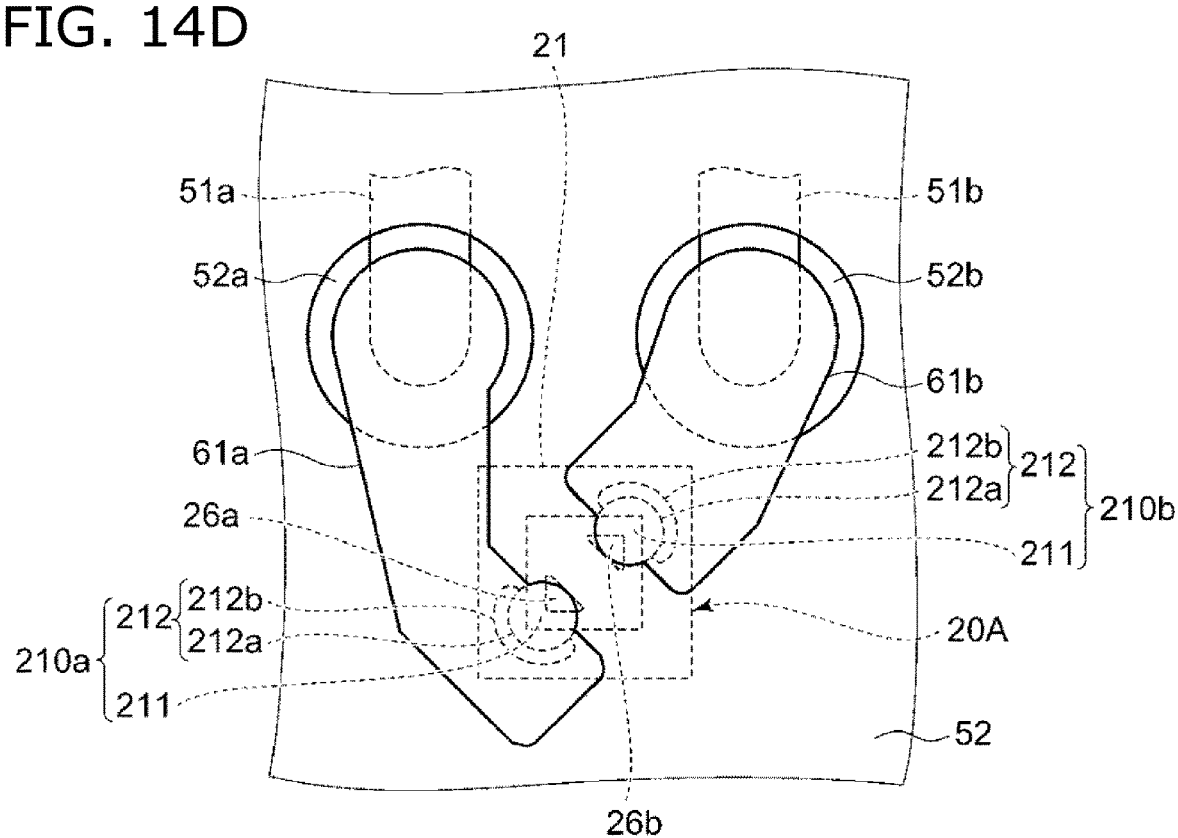

Conversely, the light source 20A shown in FIG. 14D has the orientation of the light source 20A shown in FIGS. 14A to 14C rotated 45°. In other words, the corners of the light source 20A shown in FIG. 14D face the corners of the light-emitting region 5 partitioned by the partitioning groove 14. The shapes of the hole portions 210a and 210b shown in FIG. 14D in a plan view are the same as the shapes of the hole portions 210a and 210b shown in FIG. 14A in a plan view. The shapes of the hole portions 210a and 210b shown in FIG. 14D in a plan view also can be the shapes of the hole portions 210a and 210b shown in FIG. 14B or FIG. 14C in a plan view.

Figure 14E:
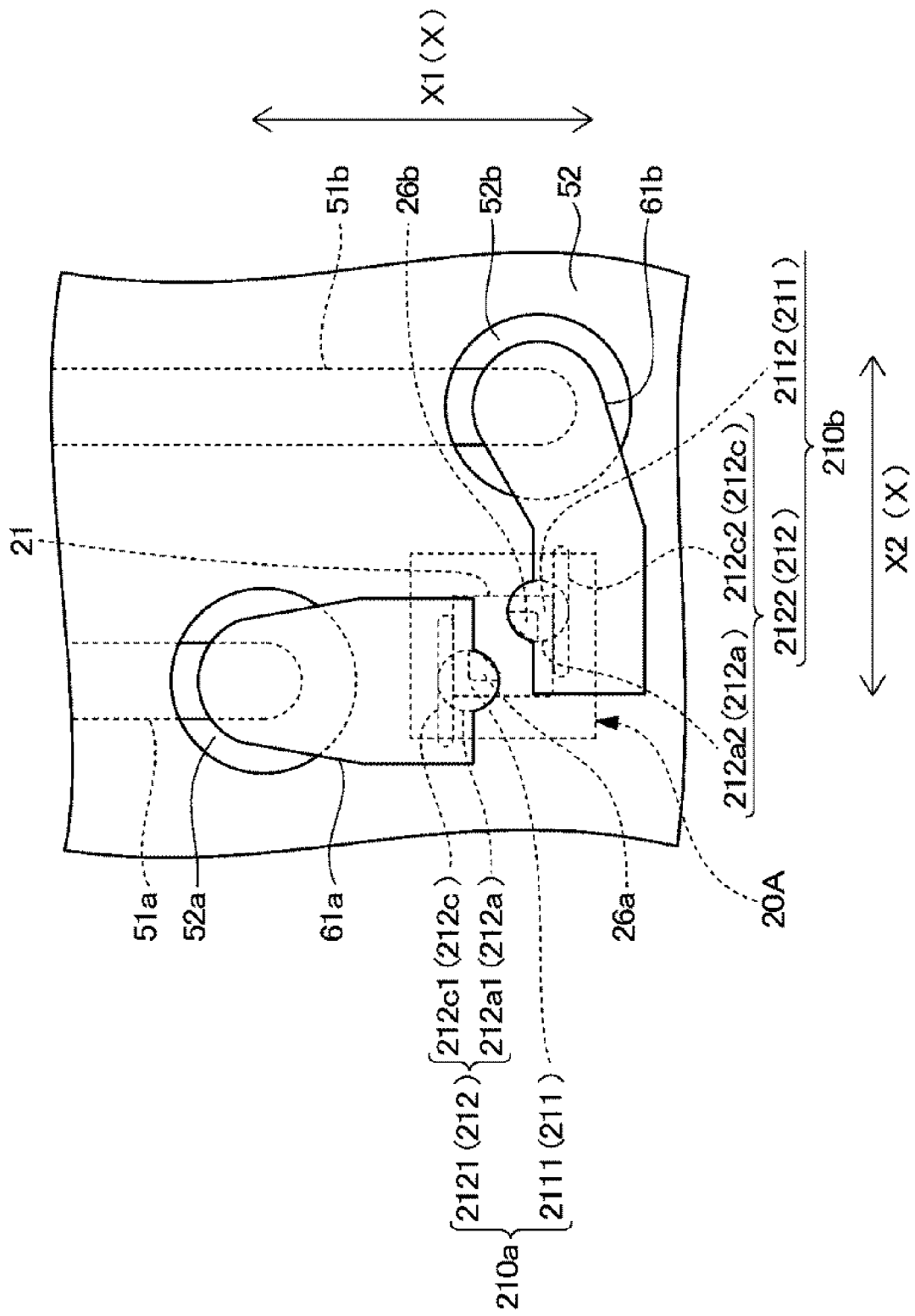
Figure 14F:
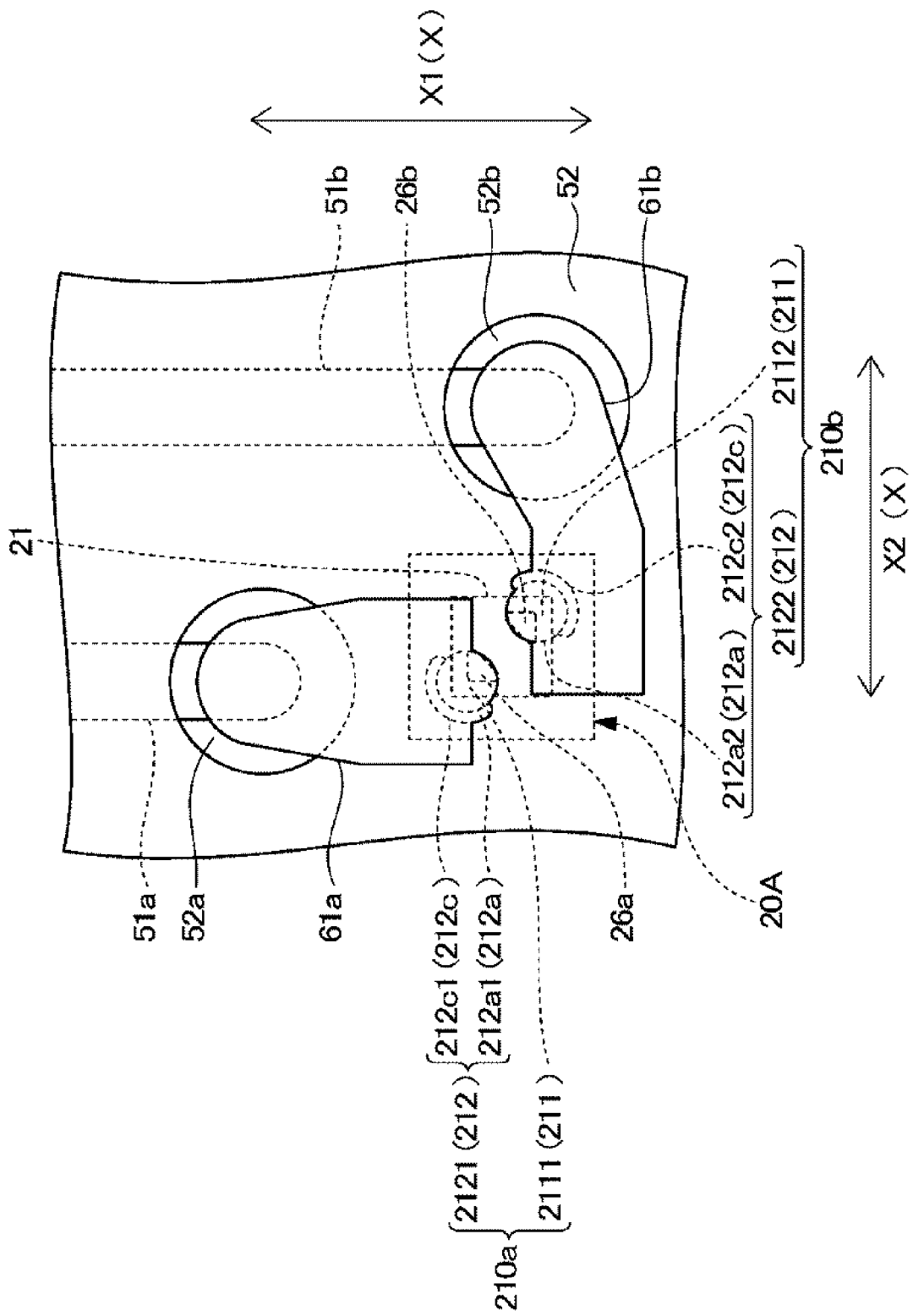

FIGS. 14E and 14F are bottom views showing examples of the lower region of the light source 20A of the light-emitting device 300A. When viewed in bottom-view in FIGS. 14E and 14F, the light source 20A, the light-emitting element 21, the positive electrode 26a, the negative electrode 26b, the hole portions 210a and 210b, the first connection portion 51a, and the second connection portion 51b that are covered with the insulating film 52, the first conductive member 61a, and the second conductive member 61b are illustrated by broken lines.

In FIGS. 14E and 14F, the first hole portion 211 of the one hole portion 210a may be called a 1A-hole portion 2111; the second hole portion 212 of the hole portion 210a may be called a 2A-hole portion 2121, and the first portion 212a of the hole portion 210a may be called a 1A-portion 212a1. In FIGS. 14E and 14F, the first hole portion 211 of the other hole portion 210b may be called a 1B-hole portion 2112; the second hole portion 212 of the hole portion 210b may be called a 2B-hole portion 2122, and the first portion 212a of the hole portion 210b may be called a 1B-portion 212a2.

In FIGS. 14E and 14F, the first direction X from the 1A-portion 212a1 toward the first connection portion 51a side may be called a 1A-direction X1, and the first direction X from the 1B-portion 212a2 toward the second connection portion 51b side may be called a 1B-direction X2. The 1A-direction X1 and the 1B-direction X2 may be the same or different directions. For example, as shown in FIGS. 14E and 14F, the 1A-direction X1 and the 1B-direction X2 may be orthogonal to each other.

Figure 14G:
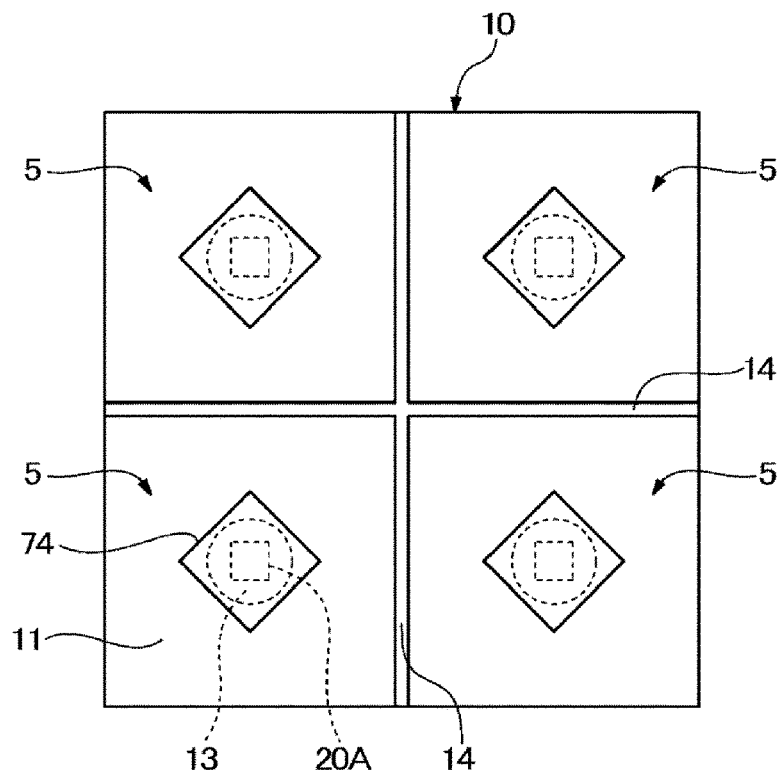
FIG. 14G is a top view showing an example of the light-emitting device of the second embodiment of the invention.

Similarly to the light source 20A shown in FIG. 14D, the light sources 20A shown in FIGS. 14E and 14F have the orientation of the light sources 20A shown in FIGS. 14A to 14C rotated 45°. In other words, as shown in FIG. 14G, at least one of the outer edges of the light source 20A is parallel to at least one of the partitioning grooves 14 extending in the lattice shape. In the specification, "parallel" includes not only the case where two straight lines do not cross even when extended, but also the case where the corner between two straight lines is within 10°.

In a plan view, the 2A-hole portion 2121 of the one hole portion 210a shown in FIG. 14E includes the 1A-portion 212a1 that overlaps the 1A-hole portion 2111, and a first elongated hole portion 212c1 that extends from the 1A-portion 212a1 and does not overlap the 1A-hole portion 2111. In a plan view, the 2B-hole portion 2122 of the other hole portion 210a shown in FIG. 14E includes the 1B-portion 212a2 that overlaps the 1B-hole portion 2112, and a second elongated hole portion 212c2 that extends from the 1B-portion 212a2 and does not overlap the 1B-hole portion 2112. The first elongated hole portion 212c1 and/or the second elongated hole portion 212c2 may be called elongated hole portions 212c. The elongated hole portion 212c may extend toward the connection portion side, i.e., in the first direction, from the first portion 212a and may extend toward the connection portion side, i.e., in the first direction, from the first portion 212a. Other than being able to extend toward the connection portion side, i.e., the first direction, from the first portion 212a, the elongated hole portion 212c is configured similarly to the second portion 212b. That is, the second portion 212b can be considered to be one form of the elongated hole portion 212c. The elongated hole portion 212c may have the same configuration as the second portion 212b.

As shown in FIG. 14E, in a plan view, the first elongated hole portion 212c1 may extend in the 1B-direction X2 orthogonal to the 1A-direction X1 from the 1A-portion 212a1. In a plan view, the second elongated hole portion 212c2 may extend in the 1B-direction X2 from the 1B-portion 212a2.

As shown in FIG. 14E, the first elongated hole portion 212c1 may include a portion that extends in the left direction and a portion that extends in the right direction from the 1A-portion 212a1 along the 1B-direction X2. In other words, the 1A-portion 212a1 may be sandwiched between the first elongated hole portion 212c1 in the 1B-direction X2. The reliability of the electrical connection between the light source and the wiring layer of the support member can be increased thereby. As shown in FIG. 14E, it is favorable for the first elongated hole portion 212c1 and/or the second elongated hole portion 212c2 to be linear. Thereby, it is easier to form the first elongated hole portion 212c1 and/or the second elongated hole portion 212c2. The number of the elongated hole portions 212c is not particularly limited; one elongated hole portion 212c may extend from one first portion 212a, or two or more elongated hole portions 212c may extend from one first portion 212a. When multiple elongated hole portions 212c extend from one first portion 212a in a plan view, the multiple elongated hole portions may extend in the same direction or in different directions.

The maximum width of the first elongated hole portion 212c1 in the 1A-direction X1 may be equal to, greater than, or less than the maximum width of the 1A-portion 212a1 in the 1A-direction X1. By setting the maximum width of the first elongated hole portion 212c1 to be greater than the maximum width of the 1A-portion 212a1 in the 1A-direction X1, the reliability of the electrical connection between the light source and the wiring layer of the support member can be increased. By setting the maximum width of the first elongated hole portion 212c1 to be equal to the maximum width of the 1A-portion 212a1 in the first direction X1, the reliability of the electrical connection between the light source and the wiring layer of the support member can be greater than when the maximum width of the first elongated hole portion 212c1 is less than the maximum width of the 1A-portion 212a1. By setting the maximum width of the first elongated hole portion 212c1 to be equal to the maximum width of the 1A-portion 212a1 in the 1A-direction X1, the patterning time of the first elongated hole portion 212c1 can be less than when the maximum width of the first elongated hole portion 212c1 is greater than the maximum width of the 1A-portion 212a1. As shown in FIG. 14E, it is favorable for the maximum width of the first elongated hole portion 212c1 in the 1A-direction X1 to be less than the maximum width of the 1A-portion 212a1 in the 1A-direction X1. The patterning time of the first elongated hole portion 212c1 can be reduced thereby.

The maximum width of the first elongated hole portion 212c1 in the 1B-direction X2 may be equal to, greater than, or less than the maximum width of the 1A-portion 212a1 in the 1B-direction X2. It is favorable for the maximum width of the first elongated hole portion 212c1 in the 1B-direction X2 to be greater than the maximum width of the 1A-portion 212a1 in the 1B-direction X2. The reliability of the electrical connection between the light source and the wiring layer of the support member can be increased thereby. By setting the maximum width of the first elongated hole portion 212c1 to be equal to the maximum width of the 1A-portion 212a1 in the 1B-direction X2, the reliability of the electrical connection between the light source and the wiring layer of the support member can be greater than when the maximum width of the first elongated hole portion 212c1 is less than the maximum width of the 1A-portion 212a1. Also, by setting the maximum width of the first elongated hole portion 212c1 to be equal to the maximum width of the 1A-portion 212a1 in the 1B-direction X2, the patterning time of the first elongated hole portion 212c1 can be less than when the maximum width of the first elongated hole portion 212c1 is greater than the maximum width of the 1A-portion 212a1. By setting the maximum width of the first elongated hole portion 212c1 to be less than the maximum width of the 1A-portion 212a1 in the 1B-direction X2, the patterning time of the first elongated hole portion 212c1 can be reduced.

It is favorable for at least a portion of the outer edge of the first elongated hole portion 212c1 and at least a portion of the outer edge of the second elongated hole portion 212c2 to be parallel in a plan view. For example, as shown in FIG. 14E, it is favorable for at least a portion of the outer edge of the first elongated hole portion 212c1 and at least a portion of the outer edge of the second elongated hole portion 212c2 to extend in the 1B-direction X2. Thereby, it is easier to form the first elongated hole portion 212c1 and the second elongated hole portion 212c2. When the first elongated hole portion 212c1 and the second elongated hole portion 212c2 are linear in a plan view, it is favorable for the direction in which the first elongated hole portion 212c1 extends and the direction in which the second elongated hole portion 212c2 extends to be parallel. Thereby, it is easier to form the first elongated hole portion 212c1 and the second elongated hole portion 212c2.

When the first elongated hole portion 212c1 and the second elongated hole portion 212c2 extend in the 1B-direction X2 as shown in FIG. 14E, it is favorable for the first elongated hole portion 212c1 and/or the second elongated hole portion 212c2 not to overlap the region from the center of the 1A-hole portion 2111 to the center of the 1B-hole portion 2112 in the 1A-direction X1. Contact between the first conductive member 61a and the second conductive member 61b can be suppressed thereby. In the specification, "the center of the first portion" means the geometric centroid of the first portion in a plan view. For example, when the first portion is circular, the center of the first portion means the center of the circle.

As shown in FIG. 14E, in the first direction X and the second direction Y, it is favorable for the first opening 52a in which a portion of the first connection portion 51a is exposed not to overlap the second opening 52b in which a portion of the second connection portion 51b is exposed. The contact between the first conductive member 61a and the second conductive member 61b can be suppressed thereby. Also, the light-emitting device can be downsized in the first direction X when the first opening 52a and the second opening 52b do not overlap in the first direction X. The light-emitting device can be downsized in the second direction Y when the first opening 52a and the second opening 52b do not overlap in the second direction Y.

As shown in FIG. 14F, in a plan view, the second hole portion 212 of the hole portions 210a and 210b includes the first portion 212a that overlaps the first hole portion 211, and the elongated hole portion 212c that extends from the first portion 212a and does not overlap the first hole portion 211. The elongated hole portion 212c is located along a portion of the outer perimeter of the first portion 212a in a plan view. As shown in FIG. 14F, it is favorable for the first elongated hole portion 212c1 and the second elongated hole portion 212c2 not to overlap the region between the 1A-portion 212a1 of the hole portion 210a and the 1B-portion 212a2 of the hole portion 210b in a plan view. The contact between the first conductive member 61a and the second conductive member 61b can be suppressed thereby.

Third Embodiment

Figure 15:
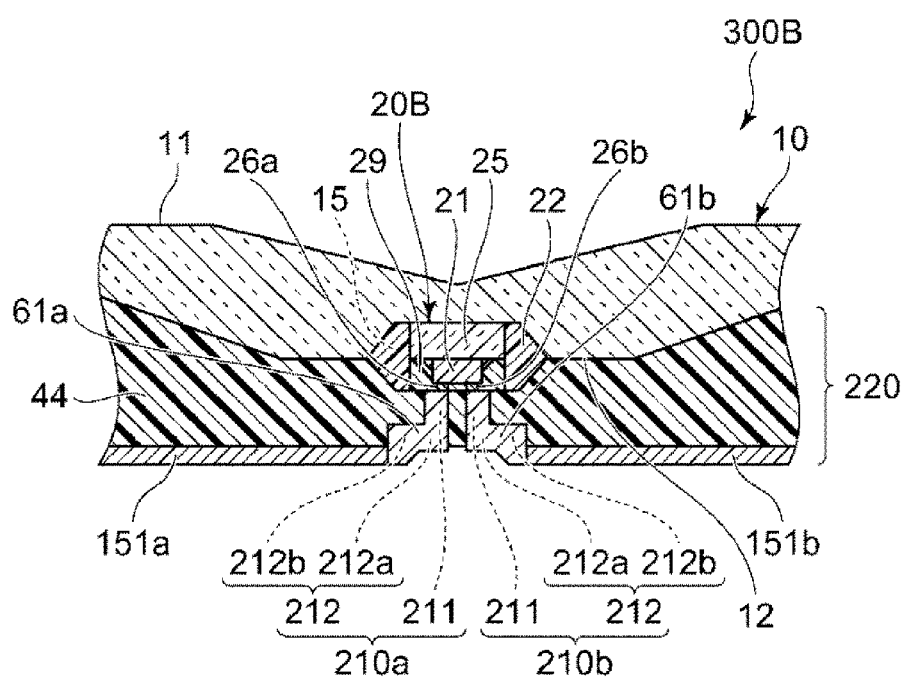
FIG. 15 is a cross-sectional view of a light-emitting device of a third embodiment of the invention.

FIG. 15 is a cross-sectional view of a light-emitting device 300B of a third embodiment of the invention.

A light source placement portion 15 is formed at the second major surface 12 side of the light guide plate 10. The light source placement portion 15 is formed as a recess that is open at the second major surface 12. A light source 20B is disposed in the light source placement portion 15.

The light source 20B includes the light-emitting element 21, a pair of electrodes (the positive electrode 26a and the negative electrode 26b) located at the lower surface of the light-emitting element 21, a fourth light-transmitting member 25, and a cover member 29. The fourth light-transmitting member 25 is located on the light-emitting element 21 and on the cover member 29. The light-emitting element 21 is bonded to the lower surface of the fourth light-transmitting member 25 by a bonding member.

A fifth light-transmitting member 22 that covers the side surface of the light source 20B is located in the light source placement portion 15. The fifth light-transmitting member 22 is, for example, a resin member that is transmissive to the light from the light source 20B.

A support member 220 includes a resin member 44 located at the second major surface 12 of the light guide plate 10, a first connection portion 151a located at the lower surface of the resin member 44, and a second connection portion 151b located at the lower surface of the resin member 44. The resin member 44 is, for example, a light-reflecting member that includes a light-diffusing material such as $TiO_2$, etc.

The pair of hole portions 210a and 210b is formed in the resin member 44 below the light source 20B. The first conductive member 61a is located in the hole portion 210a, and the second conductive member 61b is located in the hole portion 210b. The first conductive member 61a connects the positive electrode 26a and the first connection portion 151a. The second conductive member 61b connects the negative electrode 26b and the second connection portion 151b.

Each of the pair of hole portions 210a and 210b includes the first hole portion 211 that is open at the upper surface side of the resin member 44, and the second hole portion 212 that communicates with the first hole portion 211 and is open at the lower surface side of the resin member 44. In a plan view, the first hole portion 211 of the one hole portion 210a overlaps the positive electrode 26a connected with the first conductive member 61a, and the first hole portion 211 of the other hole portion 210b overlaps the negative electrode 26b connected with the second conductive member 61b.

The second hole portion 212 of the one hole portion 210a includes the first portion 212a that overlaps the first hole portion 211 in a plan view, and the second portion 212b that extends toward the first connection portion 151a side along the first direction X from the first portion 212a. The second hole portion 212 of the other hole portion 210b includes the first portion 212a that overlaps the first hole portion 211 in a plan view, and the second portion 212b that extends toward the second connection portion 151b side along the first direction X from the first portion 212a.

According to the third embodiment as well, the volume of the hole portions 210a and 210b at the lower surface side of the support member 220 can be increased by extending the second portion 212b of the second hole portion 212 that is open at the lower surface side of the support member 220 further than the first hole portion 211 toward the connection portion 151a or 151b side. Accordingly, even when the volume of the conductive paste supplied to the second portion 212b is increased and curing shrinkage occurs, a sufficient amount of the conductive paste can remain in the second portion 212b. The breakage of the conductive members 61a and 61b after curing can be prevented thereby, and the reliability of the electrical connection between the light source 20B and the connection portions 151a and 151b of the support member 220 can be increased.

Fourth Embodiment

Figure 16:
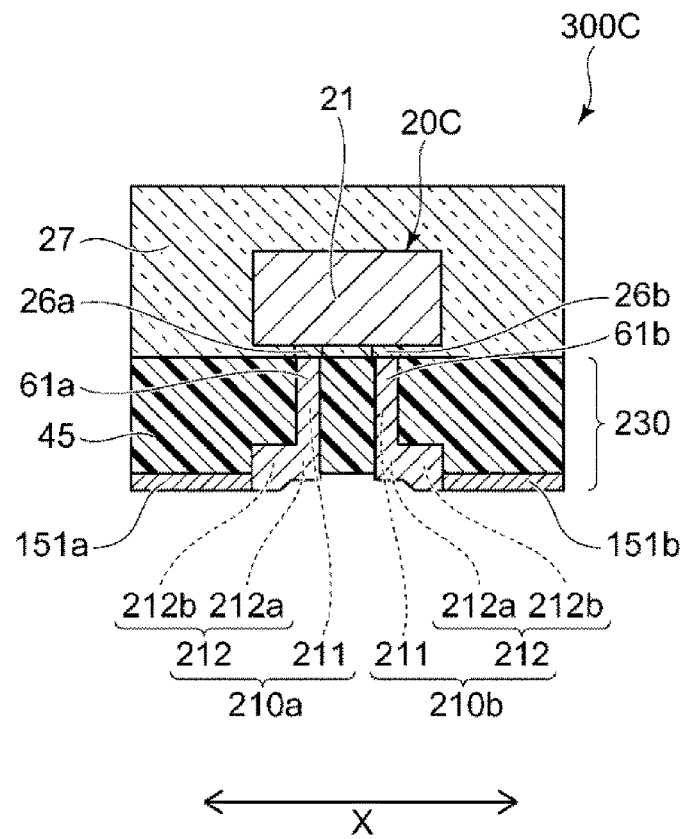
FIG. 16 is a cross-sectional view of a light-emitting device of a fourth embodiment of the invention.

FIG. 16 is a cross-sectional view of a light-emitting device 300C of a fourth embodiment of the invention.

A light source 20C includes the light-emitting element 21, and a pair of electrodes (the positive electrode 26a and the negative electrode 26b) located at the lower surface of the light-emitting element 21.

A support member 230 includes a substrate 45, the first connection portion 151a located at the lower surface of the substrate 45, and the second connection portion 151b located at the lower surface of the substrate 45. For example, the substrate 45 is made of a resin that includes a light-diffusing material such as $TiO_2$, etc. For example, the substrate 45 may be made of a ceramic, glass, or a fiber-reinforced resin such as a glass epoxy resin, etc.

The light source 20C is located on the upper surface of the resin member 45. A sixth light-transmitting member 27 is located on the upper surface of the resin member 45. The sixth light-transmitting member 27 covers the light source 20C. The sixth light-transmitting member 27 includes the functions of wavelength conversion, light diffusion, etc., according to the particles added to the sixth light-transmitting member 27.

The pair of hole portions 210a and 210b is formed in the resin member 45 below the light source 20C. The first conductive member 61a is located in the hole portion 210a, and the second conductive member 61b is located in the hole portion 210b. The first conductive member 61a connects the positive electrode 26a and the first connection portion 151a. The second conductive member 61b connects the negative electrode 26b and the second connection portion 151b.

Each of the pair of hole portions 210a and 210b includes the first hole portion 211 that is open at the upper surface side of the resin member 45, and the second hole portion 212 that communicates with the first hole portion 211 and is open at the lower surface side of the resin member 45. In a plan view, the first hole portion 211 of the one hole portion 210a overlaps the positive electrode 26a connected with the first conductive member 61a, and the first hole portion 211 of the other hole portion 210b overlaps the negative electrode 26b connected with the second conductive member 61b.

The second hole portion 212 of the one hole portion 210a includes the first portion 212a that overlaps the first hole portion 211 in a plan view, and the second portion 212b that extends toward the first connection portion 151a side along the first direction X from the first portion 212a. The second hole portion 212 of the other hole portion 210b includes the first portion 212a that overlaps the first hole portion 211 in a plan view, and the second portion 212b that extends toward the second connection portion 151b side along the first direction X from the first portion 212a.

According to the fourth embodiment as well, the volume of the hole portions 210a and 210b at the lower surface side of the support member 230 can be increased because the second portion 212b of the second hole portion 212 that is open at the lower surface side of the support member 230 extends further than the first hole portion 211 toward the connection portion 151a or 151b side. Accordingly, even when the volume of the conductive paste supplied to the second portion 212b is increased and curing shrinkage occurs, a sufficient amount of the conductive paste can remain in the second portion 212b. The breakage of the conductive members 61a and 61b after curing can be prevented thereby, and the reliability of the electrical connection between the light source 20C and the connection portions 151a and 151b of the support member 230 can be increased.

The light-emitting device 300A of the first and second embodiments and the light-emitting device 300B of the third embodiment are, for example, planar light sources. The light-emitting device 300A and the light-emitting device 300B may be line-shaped light sources. The light guide plate 10 may not be included in the light-emitting devices 300A and 300B.

Fifth Embodiment

Figure 17:
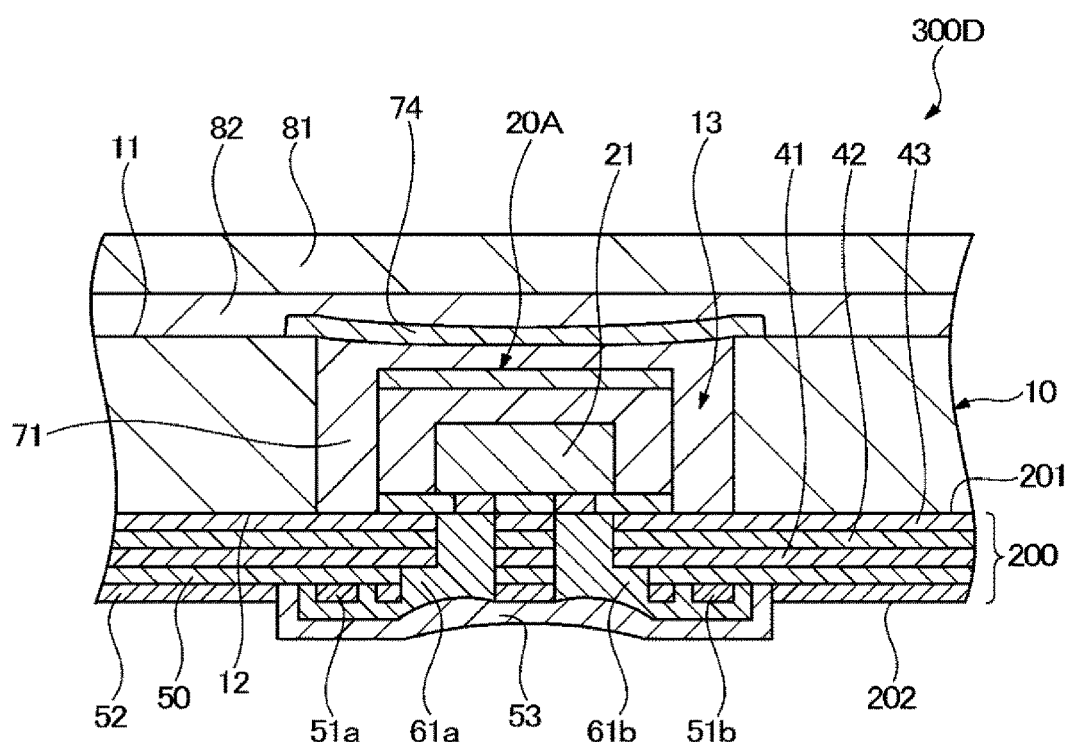
FIG. 17 is a cross-sectional view of a light-emitting device of a fifth embodiment of the invention.

FIG. 17 is a cross-sectional view of a light-emitting device 300D of a fifth embodiment of the invention.

Other than including a first member 81 and a second member 82 that cover the upper surface of the light source 20A, the light-emitting device 300D is configured similarly to the light-emitting device 300A of the first embodiment. The light-emitting device 300D includes a single layer of the second light-transmitting member 71 without including a wavelength conversion member and a third light-transmitting member in the through-hole that is the light source placement portion 13.

The first member 81 is a transmissive member that includes a phosphor. For example, a light-transmitting resin that includes a phosphor is an example of the first member 81. Materials similar to those of the first light-transmitting member 23 can be used as the phosphor and/or the light-transmitting resin. Also, a thermoplastic resin such as polyethylene terephthalate, polyester, or the like, acrylic, polycarbonate, cyclic polyolefin, glass, etc., may be used as the material of the first member 81. The first member 81 may include a known light-diffusing agent such as $TiO_2$, $SiO_2$, $Al_2O_3$, ZnO, glass, etc. The first member 81 may be a single layer or multiple layers.

For example, when blue light is emitted from the light source 20A, it is favorable for the first member 81 to include a phosphor that converts the light emitted from the light source 20A into green light and a phosphor that converts the light emitted from the light source 20A into red light. Thereby, the light-emitting device 300D can emit white light. For example, a β-sialon-based phosphor, a phosphor that has a perovskite structure, etc., are examples of the phosphor that converts to green light. For example, a nitride-based phosphor such as a CASN-based phosphor, a SCASN-based phosphor, or the like, a KSF-based phosphor, a KSAF-based phosphor, etc., are examples of the phosphor that converts to red light. When blue light and green light are emitted from the light source 20A, it is favorable for the first member 81 to include a phosphor that converts the light emitted from the light source 20A into red light. Thereby, the light-emitting device 300D can emit white light. When green light and/or red light is emitted from the light source 20A, the first member 81 may include a phosphor that converts the light emitted from the light source 20A into green light and a phosphor that converts the light emitted from the light source 20A into red light. Thereby, color modulation of the light-emitting device is easier. It is favorable for the first member 81 to include a phosphor that converts the light emitted from the light source 20A into blue light. Thereby, the color modulation of the light-emitting device is easier.

The first member 81 may contact the light source 20A and cover the upper surface of the light source 20A, may contact the second light-modulating member 74 and cover the upper surface of the light source 20A, or may cover the upper surface of the light source 20A via the second member 82 as shown in FIG. 17. The second member 82 is a member that fixes the light source 20A and the first member 81. For example, a light-transmitting resin is an example of the material of the second member 82. The second member 82 may include a phosphor and/or a light-diffusing agent.

The light-emitting device 300D of the fifth embodiment is, for example, a planar light source. The light-emitting device 300D may be a line-shaped light source. The light guide plate 10 may not be included in the light-emitting device 300D.

Sixth Embodiment

Figure 18:
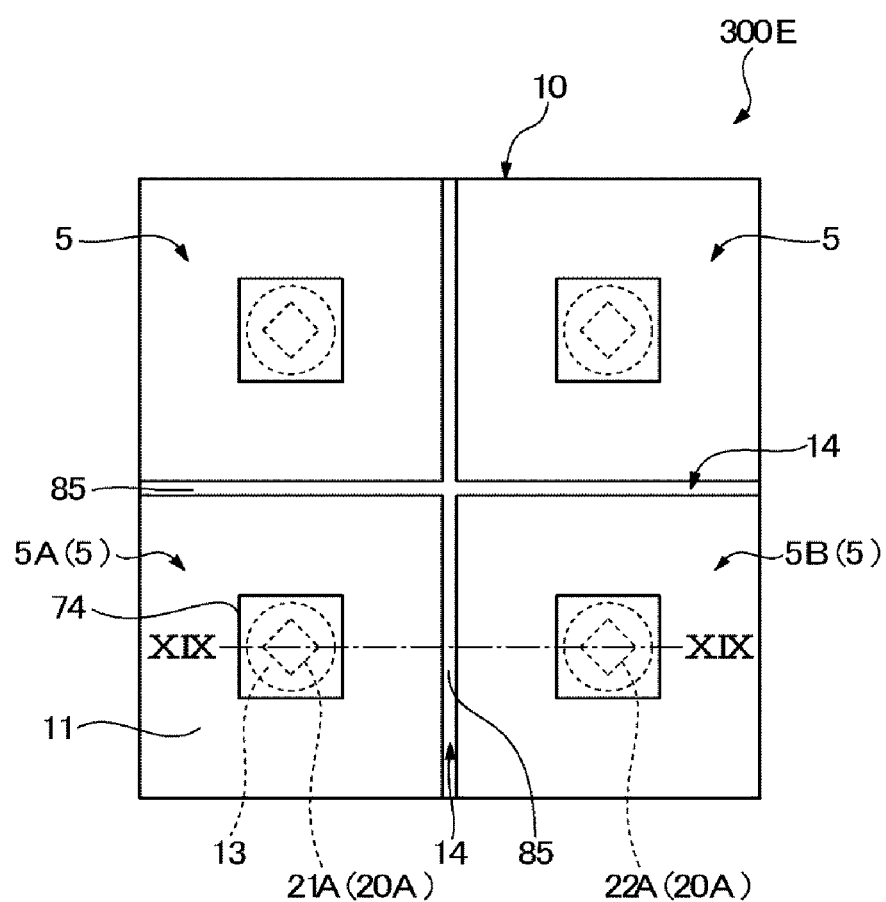
FIG. 18 is a top view of a light-emitting device of a sixth embodiment of the invention.

FIG. 18 is a top view of a light-emitting device 300E of a sixth embodiment of the invention.

Figure 19:
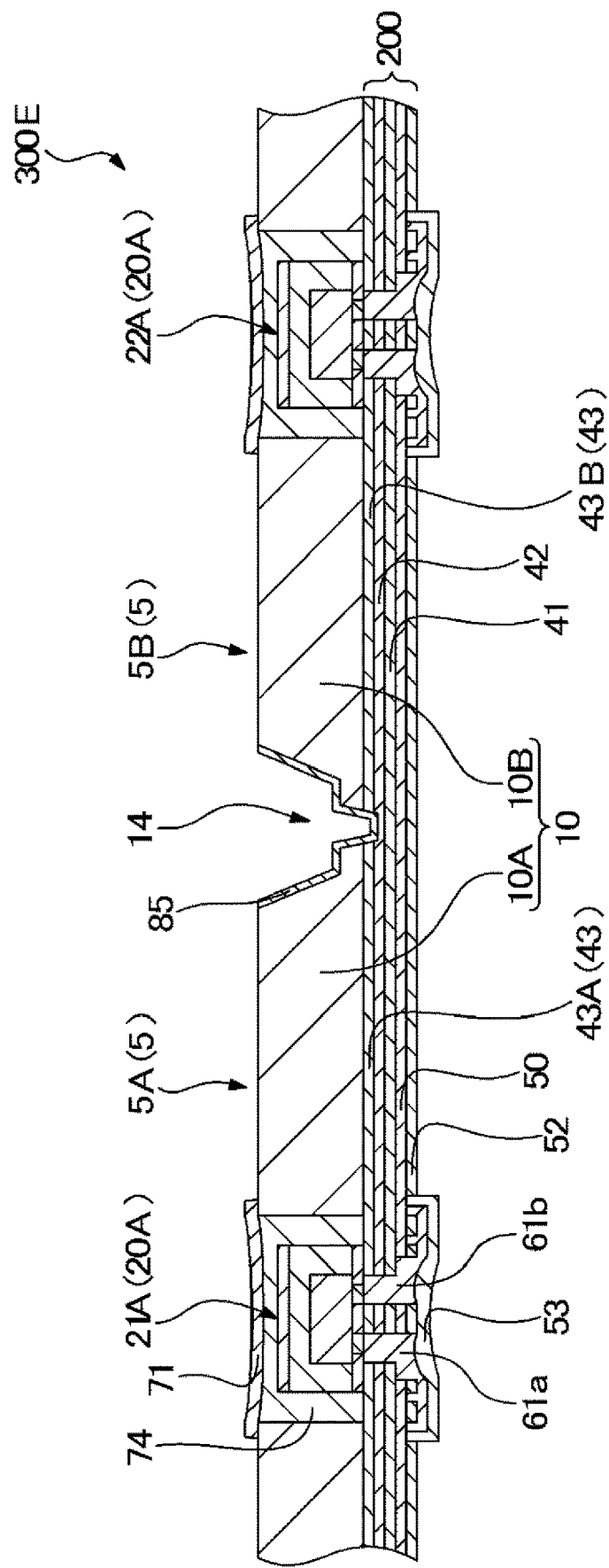
FIG. 19 is a cross-sectional view along line XIX-XIX of FIG. 18.

FIG. 19 is a cross-sectional view along line XIX-XIX of FIG. 18.

As shown in FIGS. 18 and 19, the light-emitting device 300E includes a third light-modulating member 85 positioned in the partitioning groove 14. Because the third light-modulating member 85 is positioned in the partitioning groove 14, the contrast ratio between the adjacent light-emitting regions 5 can be improved. In FIGS. 18 and 19, one light-emitting region 5 of adjacent light-emitting regions may be called a first light-emitting region 5A; another light-emitting region 5 of the adjacent light-emitting regions may be called a second light-emitting region 5B; the light source 20A that is located in the first light-emitting region 5A may be called a first light source 21A, and the light source 20A that is located in the second light-emitting region 5B may be called a second light source 22A. In the light-emitting device 300E, because the third light-modulating member 85 is in the partitioning groove 14, a portion of the light traveling from the first light source 21A to the second light-emitting region 5B is shielded by the third light-modulating member 85. Thereby, the contrast ratio between the first light-emitting region 5A and the second light-emitting region 5B can be improved when the first light source 21A is lit and the second light source 22A is unlit. It is sufficient for the third light-modulating member 85 to surround at least a portion of the first light-emitting region 5A when viewed in top-view. The third light-modulating member 85 may surround the first light-emitting region 5A without a break when viewed in top-view. A material similar to that of the first light-modulating member can be used as the material of the third light-modulating member 85.

As shown in FIG. 19, the light guide plate 10 includes a first light guide portion 10A and a second light guide portion 10B that are separated by the partitioning groove 14. At least a portion of the side surface of the first light guide portion 10A facing the second light guide portion 10B is covered with the third light-modulating member 85. The entire side surface of the first light guide portion 10A facing the second light guide portion 10B may be covered with the third light-modulating member 85. Thereby, the light that travels from the first light source 21A to the second light-emitting region 5B is easily shielded by the third light-modulating member 85. The amount of the light propagating between the first light-emitting region 5A and the second light-emitting region 5B can be adjusted by appropriately selecting the surface area of the third light-modulating member 85 that covers the side surface of the first light guide portion 10A facing the second light guide portion 10B.

Figure 20A:
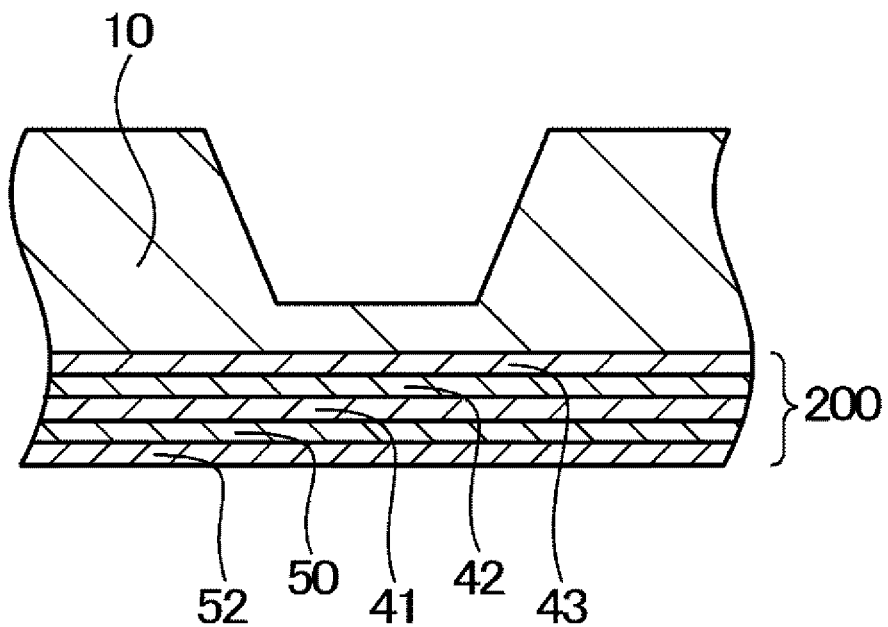
FIGS. 20A and 20B are cross-sectional views showing a method for manufacturing the light-emitting device of the sixth embodiment of the invention.
Figure 20B:
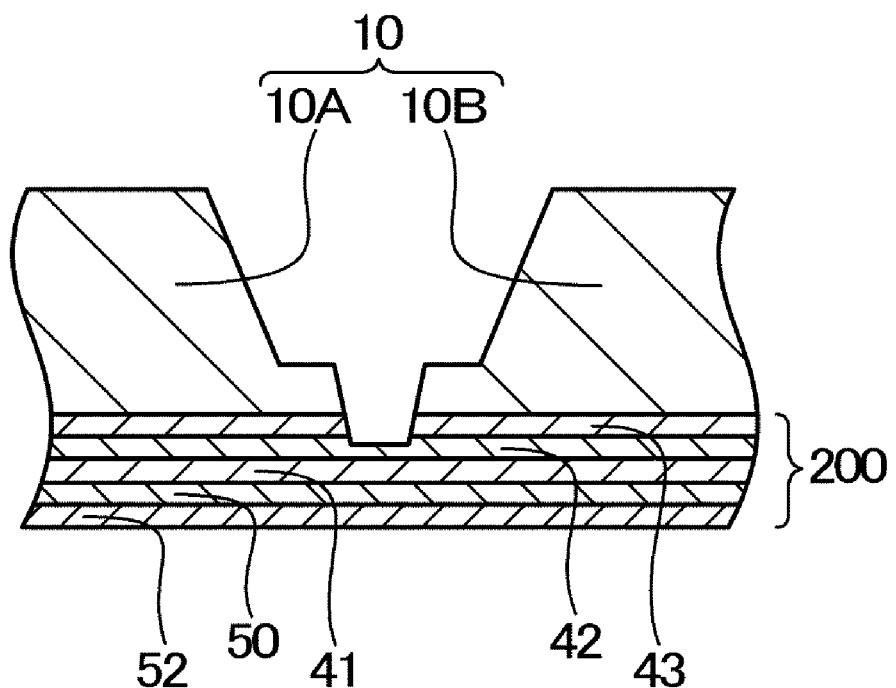

As shown in FIG. 19, the second bonding member 43 includes a second-bonding first-portion 43A and a second-bonding second-portion 43B separated by the partitioning groove 14. The method for forming the second-bonding first-portion 43A and the second-bonding second-portion 43B is not particularly limited. For example, the light guide plate 10 is located on the support member 200 as shown in FIG. 20A. Then, as shown in FIG. 20B, the first light guide portion 10A and the second light guide portion 10B are formed by removing a portion of the light guide plate 10. At this time, the second-bonding first-portion 43A and the second-bonding second-portion 43B can be formed by removing a portion of the second bonding member 43. When removing the portion of the light guide plate 10, the light-reflecting member 42 may be divided into a plurality by removing a portion of the light-reflecting member 42. When removing the portion of the light guide plate 10, the first bonding member 41 may be divided into a plurality by removing a portion of the first bonding member 41. By removing the portion of the light guide plate 10, the light guide plate 10 may be divided into the first light guide portion 10A and the second light guide portion 10B, or may be divided into three or more light guide portions. By appropriately selecting the shape of the light guide plate 10, the amount of the light propagating between the first light-emitting region 5A and the second light-emitting region 5B can be adjusted. For example, a known method such as cutting, laser patterning, etc., can be used as the method for removing the portion of the light guide plate 10. After forming the first light guide portion 10A and the second light guide portion 10B by removing the portion of the light guide plate 10, the third light-modulating member 85 that covers the side surfaces of the first light guide portion 10A and the second light guide portion 10B is formed. For example, a known method such as printing, potting, spraying, etc., can be used as the method for forming the third light-modulating member 85.

Figure 21A:
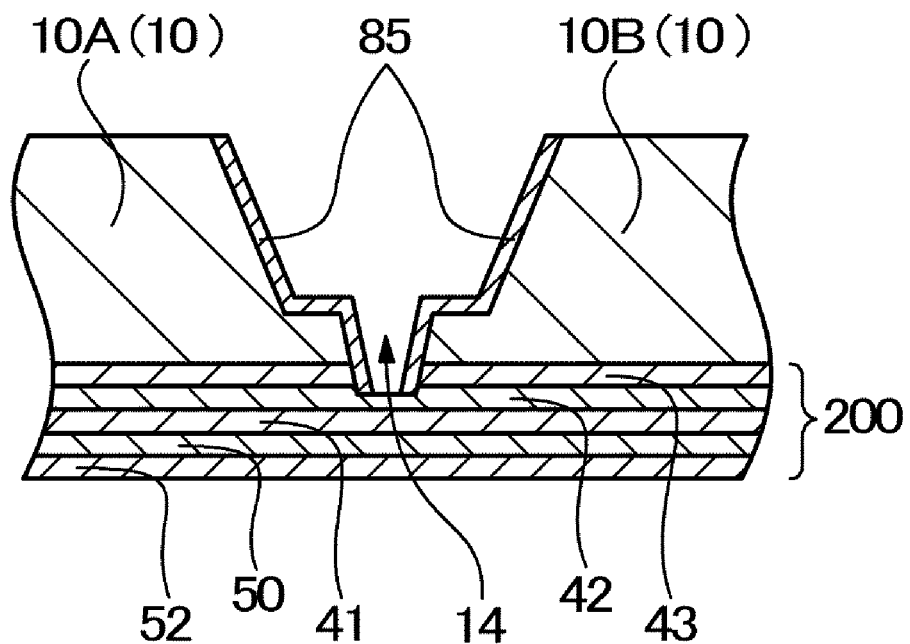
FIGS. 21A to 21C are cross-sectional views showing an example of a periphery of a partitioning groove of the light-emitting device of the sixth embodiment of the invention.
Figure 21B:
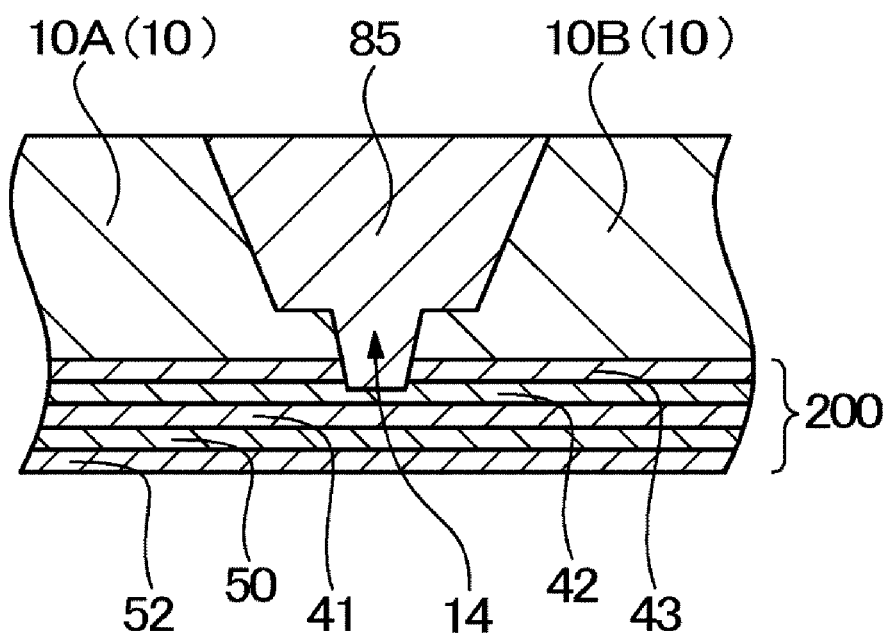
Figure 21C:
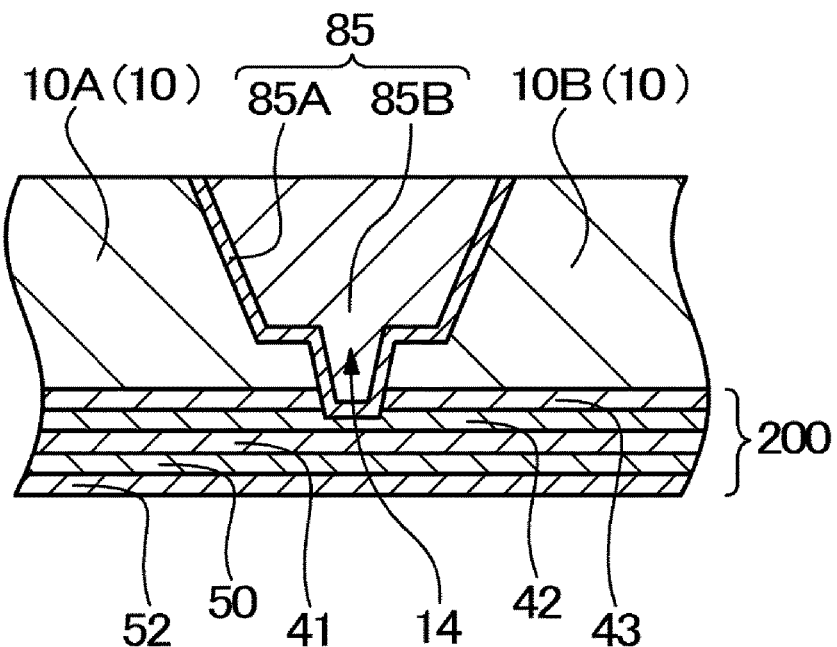

The third light-modulating member 85 may continuously cover the side surface of the first light guide portion 10A and the side surface of the second light guide portion 10B as shown in FIG. 19, or the third light-modulating member 85 may be divided into the third light-modulating member 85 that covers the side surface of the first light guide portion 10A and the third light-modulating member 85 that covers the side surface of the second light guide portion 10B as shown in FIG. 21A. The third light-modulating member 85 is not easily detached from the light guide plate 10 when the third light-modulating member 85 continuously covers the side surface of the first light guide portion 10A and the side surface of the second light guide portion 10B. By dividing the third light-modulating member 85 into the third light-modulating member 85 that covers the side surface of the first light guide portion 10A and the third light-modulating member 85 that covers the side surface of the second light guide portion 10B, warp of the support member 200 due to the thermal expansion coefficient difference of the members included in the third light-modulating member 85 and the support member 200 can be suppressed more than when the third light-modulating member 85 continuously covers the side surface of the first light guide portion 10A and the side surface of the second light guide portion 10B. The third light-modulating member 85 may fill at least a portion of the partitioning groove 14. As shown in FIG. 21B, the third light-modulating member 85 may fill the entire partitioning groove 14. The volume of the third light-modulating member 85 is more easily increased thereby; therefore, the amount of the light propagating between adjacent light-emitting regions is more easily adjusted. As shown in FIG. 21C, the third light-modulating member 85 may include a layer-shaped (film-shaped) third-light-modulating first-portion 85A that covers the side surface of the first light guide portion 10A and the side surface of the second light guide portion 10B, and a third-light-modulating second-portion 85B that contacts the third-light-modulating first-portion 85A and fills at least a portion of the partitioning groove 14. The amount of the light propagating between the adjacent light-emitting regions is more easily adjusted thereby.

Seventh Embodiment

Figure 22:
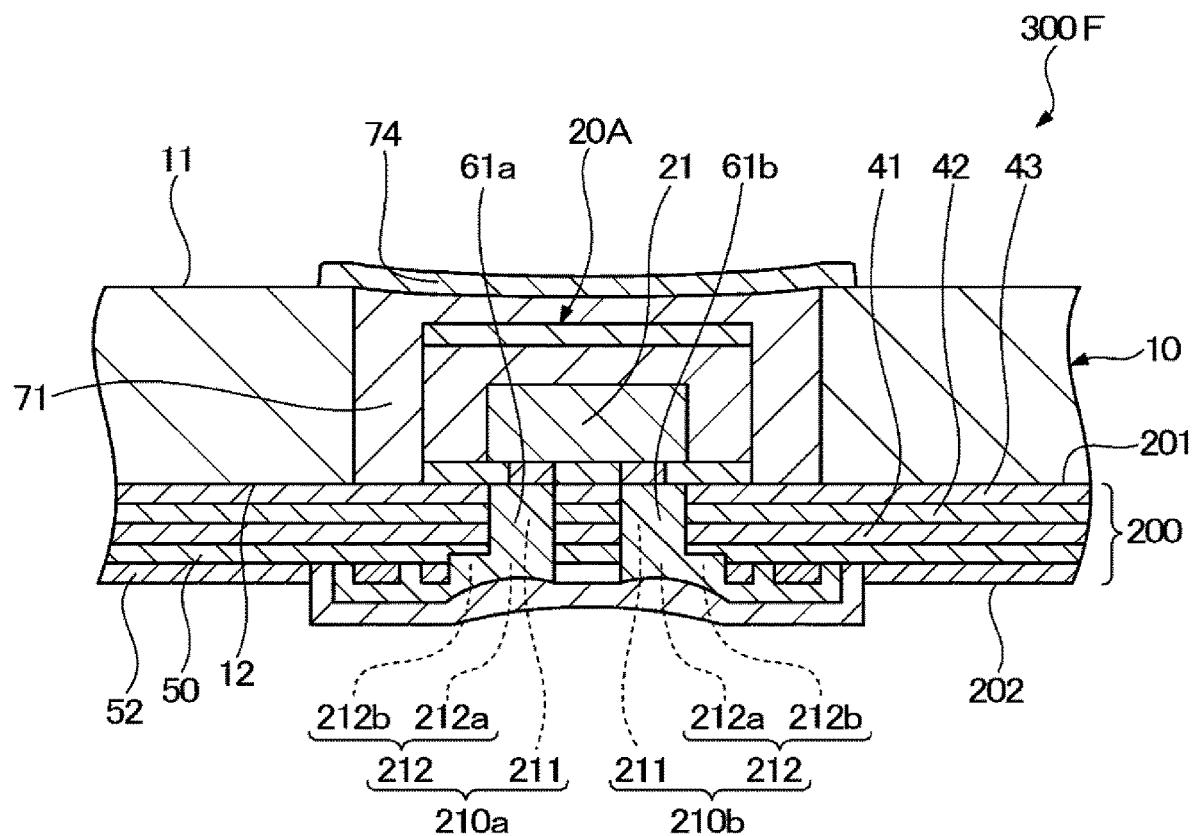
FIG. 22 is a cross-sectional view of a light-emitting device of a seventh embodiment of the invention.

FIG. 22 is a cross-sectional view of a light-emitting device 300F of a seventh embodiment of the invention.

Figure 23:
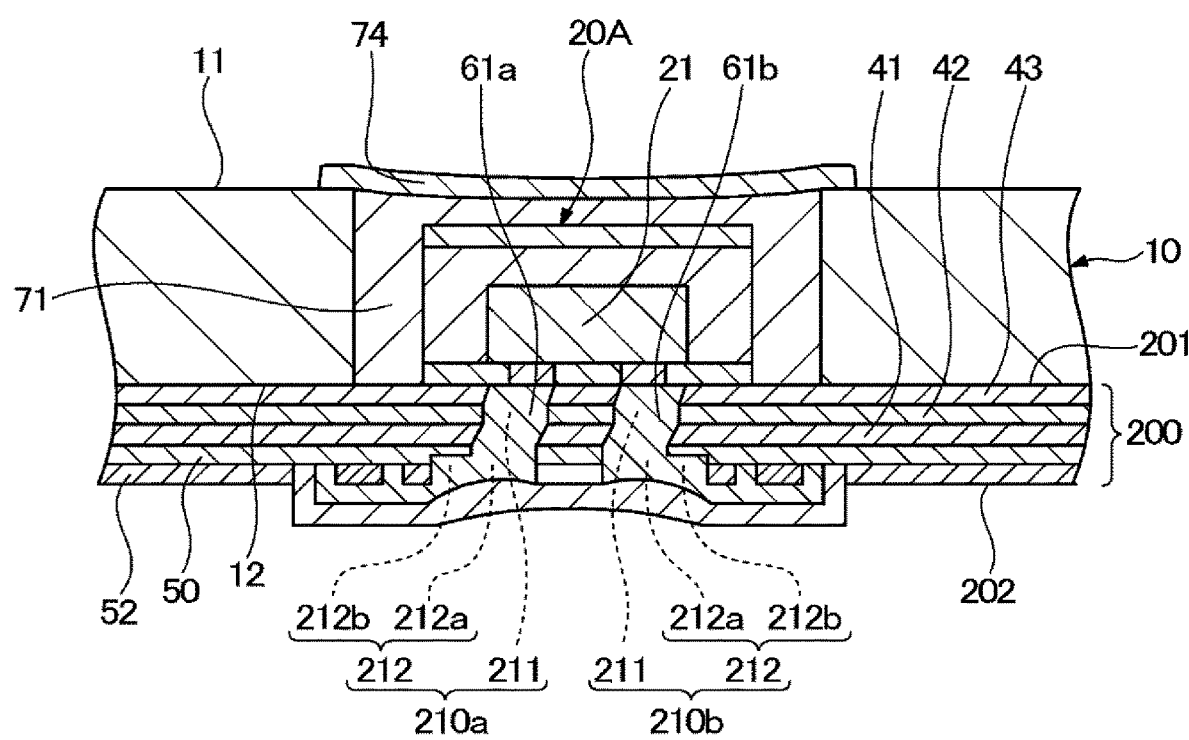
FIG. 23 is a top view showing an example of the light-emitting device of the seventh embodiment of the invention.

FIG. 23 is a cross-sectional view showing an example of the light-emitting device of the seventh embodiment of the invention.

As shown in FIG. 22, the conductive members 61a and 61b contact the lower surface of the wiring substrate 50 in the second portion 212b of the second hole portion 212. The thickness of the portion of the wiring substrate 50 overlapping the second portion 212b of the second hole portion 212 when viewed in top-view is less than the thickness of the portion of the wiring substrate 50 positioned at the outer side of the second portion 212b of the second hole portion 212. The thickness of the portion of the wiring substrate 50 overlapping the second portion 212b of the second hole portion 212 when viewed in top-view can be reduced by removing a portion of the wiring substrate 50 when forming the second portion 212b of the second hole portion 212 by laser patterning, etc. By causing a portion of the wiring substrate 50 overlapping the second portion 212b of the second hole portion 212 when viewed in top-view to remain, the removal of the portion of the first bonding member 41 overlapping the second portion 212b of the second hole portion 212 when viewed in top-view can be suppressed. The adhesion between the wiring substrate 50 and the first bonding member 41 is improved thereby.

The inner side surfaces that define the hole portions 210a and 210b may be orthogonal to the second major surface 12 of the light guide plate 10 as shown in FIG. 22, or at least a portion of the inner side surfaces that define the hole portions 210a and 210b may be oblique to the second major surface 12 of the light guide plate 10 as shown in FIG. 23. When the first bonding member 41 and/or the second bonding member 43 includes an OCA (Optical Clear Adhesive), at least a portion of the inner side surfaces that define the hole portions 210a and 210b may be oblique to the second major surface 12 of the light guide plate 10. Because the shape of the OCA changes more easily than a cured resin, the role of a buffer material can be performed by using an OCA as the first bonding member 41 and/or the second bonding member 43. For example, even when the deformation amount of the wiring substrate 50 and the deformation amount of the light-reflecting member 42 due to heat are different, the detachment of the wiring substrate 50 and the light-reflecting member 42 can be suppressed by the shape of the OCA changing. Also, the inner side surfaces of the hole portions 210a and 210b that are defined by the first bonding member 41 and/or the second bonding member 43 may be oblique to the second major surface 12 of the light guide plate 10 as shown in FIG. 23 due to the deformation of the first bonding member 41 and/or the second bonding member 43 that is the OCA. When the OCA deforms due to the thermal expansion coefficient difference between the wiring substrate 50 and the light-reflecting member 42, when viewed in top-view, the center of the hole portions 210a and 210b that are defined by the upper surface of the second bonding member 43 are positioned further outward than the center of the hole portions 210a and 210b that are defined by the lower surface of the first bonding member 41. The center of the hole portions 210a and 210b that is defined by the lower surface of the first bonding member 41 may be called a first center, and the center of the hole portions 210a and 210b that is defined by the upper surface of the second bonding member 43 may be called a second center. In the specification, the second center being positioned further outward than the first center means that the second center is separated more than the first center from the center of the support member 200. The center of the support member 200 means the geometric centroid of the support member 200 when viewed in top-view. The center of the hole portions 210a and 210b means the geometric centroid of the hole portions 210a and 210b when viewed in top-view. In FIG. 23, the center of the support member 200 is at the left side of the light source 20A. The shortest distance from the first center to the second center easily increases as the first center becomes distant to the center of the support member 200.

Eighth Embodiment

Figure 24:
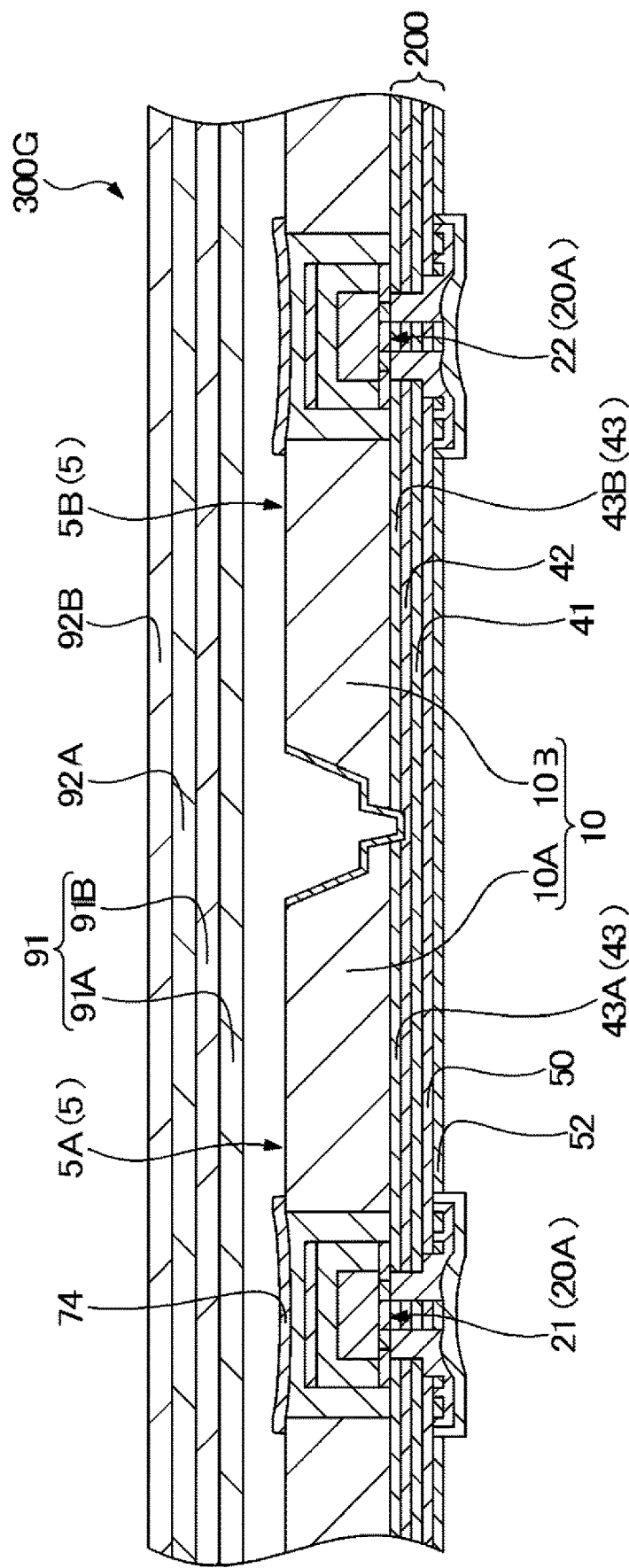
FIG. 24 is a cross-sectional view of a light-emitting device of a eighth embodiment of the invention.

FIG. 24 is a cross-sectional view of a light-emitting device 300G of an eighth embodiment of the invention.

The light-emitting device 300G includes a diffuser plate 91, a first prism sheet 92A, and a second prism sheet 92B that cover the multiple light-emitting regions 5. The diffuser plate 91 may contact the second light-modulating member 74 and/or the light guide plate 10, or may be located at a spacing away from the second light-modulating member 74 and/or the light guide plate 10 as shown in FIG. 24. The diffuser plate 91 is a member that widens the directional characteristics of the light by diffusing the incident light. The diffuser plate 91 can reduce the uneven luminance of the light emitted from the multiple light-emitting regions by covering the multiple light-emitting regions 5. As a structure that diffuses the incident light, for example, an unevenness may be provided in the surface of the diffuser plate 91, or a member that has a different refractive index may be included in the base material of the diffuser plate 91. It is favorable for the diffuser plate 91 to be formed from a material that has low optical absorption for visible light. For example, a polycarbonate resin, a polystyrene resin, an acrylic resin, a polyethylene resin, etc., are examples of the material of the diffuser plate 91. The diffuser plate 91 can include a light-diffusing sheet, an optical sheet commercially available under the name of diffuser film, etc. The number of stacks of the diffuser plate 91 that covers the multiple light-emitting regions 5 may be a single layer or multiple layers. For example, as shown in FIG. 24, the diffuser plate 91 may be the two layers of a first diffuser plate 91A and a second diffuser plate 91B.

The first prism sheet 92A covers the multiple light-emitting regions 5 via the diffuser plate 91. The second prism sheet 92B covers the multiple light-emitting regions 5 via the diffusion sheet 85 and the first prism sheet 92A. The first prism sheet 92A and the second prism sheet 92B each have structures in which multiple prisms that extend in a prescribed direction are arranged. For example, the first prism sheet 92A includes multiple prisms extending in a third direction, and the second prism sheet 92B includes multiple prisms extending in a fourth direction orthogonal to the third direction. The first prism sheet 92A and the second prism sheet 92B refract the light incident from various directions toward a fifth direction toward a display panel or the like facing the light-emitting device. The fifth direction is orthogonal to the third and fourth directions and is the same direction as the thickness direction of the light guide plate 10, etc. Therefore, the light that is emitted from the second prism sheet 92B includes a large light component traveling in the fifth direction; therefore, the luminance when the light-emitting device 300G is viewed in top-view can be increased. Polyethylene terephthalate, acrylic, etc., can be used as the materials of the first prism sheet 92A and the second prism sheet 92B. The first prism sheet 92A and the second prism sheet 92B can include an optical sheet commercially available under the name of prism sheet, etc.

What is claimed is:

1. A light-emitting device comprising:
    a support member having a first surface and a second surface opposite the first surface, the support member comprising:
        a wiring layer comprising a connection portion located at the second surface, and
        a hole portion separated from the connection portion in a plan view, the hole portion extending from the first surface to the second surface;
    a light source located on the first surface of the support member, the light source comprising a positive electrode and a negative electrode;
    a conductive member located in the hole portion, the conductive member connecting the connection portion and one of the positive electrode or the negative electrode; and
    a light guide plate located on the support member, the light guide plate being light transmissive and having a first major surface, a second major surface at a side opposite to the first major surface, and a through hole extending from the first major surface to the second major surface, the second major surface facing the support member; wherein:
    the light source is located on the support member in the through hole;
    the connection portion is located in a region other than between the positive electrode and the negative electrode in a plan view;
    the hole portion comprises:
        a first hole portion open at a first surface side, and
        a second hole portion open at a second surface side and communicating with the first hole portion;
    the first hole portion overlaps said one of the positive electrode or the negative electrode that is connected with the conductive member in a plan view;
    the second hole portion comprises:
        a first portion overlapping the first hole portion in a plan view, and
        a second portion extending in a first direction, the first direction being from the first portion toward a connection portion side; and
    a width of the hole portion in the first direction at the second surface side is greater than a width of the hole portion in the first direction at the first surface side.

2. The device according to claim 1, wherein:
    in a second direction orthogonal to the first direction, a width of the second portion is greater than a width of the first portion.

3. The device according to claim 2, wherein:
    the second portion extends to a position overlapping the connection portion in the second direction.

4. The device according to claim 1, wherein:
    the support member comprises:
        a wiring substrate comprising the wiring layer, and
        a light-reflecting member located between the wiring substrate and the light source;
    the first hole portion extends through the light-reflecting member; and
    the second hole portion extends through the wiring substrate but does not reach the light-reflecting member.

5. The device according to claim 1, wherein:
    the connection portion comprises a first connection portion and a second connection portion;
    a pair of the hole portions is located to correspond respectively to the positive electrode and the negative electrode; and
    the conductive member comprises:
        a first conductive member located in one hole portion of the pair of hole portions, the first conductive member connecting the positive electrode and the first connection portion, and
        a second conductive member located in the other hole portion of the pair of hole portions, the second conductive member connecting the negative electrode and the second connection portion.

6. A light-emitting device comprising:
    a support member having a first surface and a second surface opposite the first surface, the support member comprising:
        a wiring layer comprising a connection portion located at the second surface, and
        a hole portion separated from the connection portion in a plan view, the hole portion extending from the first surface to the second surface;
    a light source located on the first surface of the support member, the light source comprising a positive electrode and a negative electrode;
    a conductive member located in the hole portion, the conductive member connecting the connection portion and one of the positive electrode or the negative electrode; and
    a light guide plate located on the support member, the light guide plate being light transmissive and having a first major surface, a second major surface at a side opposite to the first major surface, and a through hole extending from the first major surface to the second major surface, the second major surface facing the support member; wherein:
    the light source is located on the support member in the through hole;
    the connection portion is located in a region other than between the positive electrode and the negative electrode in a plan view;
    the hole portion comprises:
        a first hole portion open at the first surface side, and
        a second hole portion open at the second surface side and communicating with the first hole portion;
    the first hole portion overlaps said one of the positive electrode or the negative electrode that is connected with the conductive member in a plan view;
    the second hole portion comprises:
        a first portion overlapping the first hole portion in a plan view, and
        an elongated hole portion extending from the first portion, the elongated hole portion not overlapping the first hole portion; and
    a width of the hole portion in the first direction at the second surface side is greater than a width of the hole portion in the first direction at the first surface side.

7. The device according to claim 1, further comprising an insulating film covering and contacting the conductive member, wherein:

the conductive member has a first surface that contacts one of the positive electrode or the negative electrode and a second surface opposite of the first surface of the conductive member;

the insulating film covers and contacts the second surface of the conductive member; and the second surface of the conductive member is not exposed from the insulating film.

8. The device according to claim 7, wherein the insulating film covers part of the wiring layer.

9. The device according to claim 8, wherein the insulating film contacts the part of the wiring layer.

10. The device according to claim 1, wherein, in a plan view, the positive electrode and the negative electrode are separated from the wiring layer.

11. The device according to claim 1, wherein the conductive member fills an entirety of the first hole portion and the second hole portion.

12. The device according to claim 1, wherein:

the wiring layer has a length in the first direction, a width in a second direction orthogonal to the first direction, and a thickness in a third direction that is orthogonal to the first direction and the second direction; and the width and the length are greater than the thickness.

\* \* \* \* \*